US010096533B2

(12) United States Patent
Jain et al.

(10) Patent No.: US 10,096,533 B2
(45) Date of Patent: Oct. 9, 2018

(54) MULTIPLE BARRIER LAYER ENCAPSULATION STACK

(71) Applicant: SAGE Electrochromics, Inc., Faribault, MN (US)

(72) Inventors: Avanti M. Jain, Richland, WA (US); Jean-Christophe Giron, Edina, MN (US)

(73) Assignee: SAGE Electrochromics, Inc., Faribault, MN (US)

( * ) Notice: Subject to any disclaimer, the term of this patent is extended or adjusted under 35 U.S.C. 154(b) by 0 days.

(21) Appl. No.: 14/944,072

(22) Filed: Nov. 17, 2015

(65) Prior Publication Data

US 2016/0141258 A1 May 19, 2016

Related U.S. Application Data

(60) Provisional application No. 62/080,796, filed on Nov. 17, 2014.

(51) Int. Cl.
*H01L 23/31* (2006.01)
*H01L 21/02* (2006.01)
(Continued)

(52) U.S. Cl.
CPC ............... *H01L 23/31* (2013.01); *B32B 27/00* (2013.01); *B32B 27/06* (2013.01);
(Continued)

(58) Field of Classification Search
CPC ......... H01L 23/02; H01L 23/28; H01L 23/29; H01L 23/291; H01L 23/293; H01L 23/31; H01L 23/3135
See application file for complete search history.

(56) References Cited

U.S. PATENT DOCUMENTS 8,445,937 B2 * 5/2013 Carcia .................. C23C 16/403
257/100
2006/0163560 A1 7/2006 Choi
(Continued)

FOREIGN PATENT DOCUMENTS

JP 2007095572 4/2007
JP 2012510649 5/2012

OTHER PUBLICATIONS

Jay S. Lewis, et al., "Thin-Film Permeation-Barrier Technology for Flexible Organic Light-Emitting Devices", IEEE Journal of Selected Topics in Quantum Electronics, vol. 10, No. 1, Jan./Feb. 2004, pp. 45-57.

(Continued)

*Primary Examiner* — Eduardo A Rodela
(74) *Attorney, Agent, or Firm* — Robert C. Kowert; Meyertons, Hood, Kivlin, Kowert & Goetzel, P.C.

(57) ABSTRACT

A process for encapsulating an apparatus to restrict environmental element permeation between the apparatus and an external environment includes applying multiple barrier layers to the apparatus and preceding each layer application with a separate cleaning of the presently-exposed apparatus surface, resulting in an apparatus which includes an encapsulation stack, where the encapsulation stack includes a multi-layer stack of barrier layers. Each separate cleaning removes particles from the presently-exposed apparatus surface, exposing gaps in the barrier layer formed by the particles, and the subsequently-applied barrier layer at least partially fills the gaps, so that a permeation pathway through the encapsulation stack via gap spaces is restricted. The quantity of barrier layers applied to form the stack can be based on a determined probability that a stack of the particular quantity of barrier layers is independent of at least (Continued)

a certain quantity of continuous permeation pathways through the stack.

20 Claims, 14 Drawing Sheets

(51) Int. Cl.
*H01L 23/29* (2006.01)
*H01L 23/28* (2006.01)
*B32B 27/00* (2006.01)
*B32B 27/06* (2006.01)

(52) U.S. Cl.
CPC ........ *H01L 21/02057* (2013.01); *H01L 23/28* (2013.01); *H01L 23/29* (2013.01); *H01L 23/291* (2013.01); *H01L 23/293* (2013.01); *H01L 23/3135* (2013.01); *B32B 2307/50* (2013.01); *B32B 2307/7242* (2013.01); *B32B 2307/7244* (2013.01); *B32B 2307/7246* (2013.01); *B32B 2307/7248* (2013.01); *G02F 2201/501* (2013.01)

(56) References Cited

U.S. PATENT DOCUMENTS

| | | | |
|---|---|---|---|
| 2010/0294335 A1* | 11/2010 | Huang | H01L 31/0392 |
| | | | 136/244 |
| 2010/0330748 A1* | 12/2010 | Chu | H01L 51/0024 |
| | | | 438/127 |
| 2012/0138947 A1 | 6/2012 | Li et al. | |
| 2012/0164434 A1 | 6/2012 | Ramadas et al. | |
| 2012/0249829 A1* | 10/2012 | Izuha | H01L 27/14621 |
| | | | 348/229.1 |
| 2013/0334511 A1 | 12/2013 | Savas et al. | |
| 2014/0151656 A1 | 6/2014 | Zeng et al. | |
| 2015/0069534 A1* | 3/2015 | Ke | H01L 29/4966 |
| | | | 257/411 |

OTHER PUBLICATIONS

Robert Jan Visser, Barix Multilayers: a Water and Oxygen Barrier for Flexible Organic Electronics, Vitex Systems, Inc., 2005, pp. 1-28.
Bruce Duncan, et al., "Review of Measurement and Modelling of Permeation and Diffusion in Polymers", NPL Report DEPC MPR 012, Jan. 2005, pp. 1-68.
Petri Johansson, et al., "Atomic Layer Deposition Process for Barrier Applications of Flexible Packaging", Apr. 18-21, 2010, pp. 1-33.
Eric Deguns Ph. D., "Atomic Layer Deposition: An Introduction to Theory and Applications", Cambridge NanoTech, Oct. 4, 2011, pp. 1-48.
Takahiro Mori, "Development of High Barrier Film for OLED Devices", Konica Minolta, Inc., Jun. 19, 2013, pp. 1-35.
Michiel Coenen, "Contamination and defect control for increased yield for large-scale R2R production of OPV and OLED", Industrial Technologies, 2014, pp. 1-19.
Mohamed Elrawemi, et al., "Modelling water vapour permeability through atomic layer deposition coated photovoltaic barrier defects", 2014, URL: http://dx.doi.org/10.1016/j.tsf.2014.08.042, pp. 1-6.
International Search Report and Written Opinion from PCT/US2015/061182, dated Feb. 23, 2016, Sage Electrochromics, Inc., pp. 1-9.
Office Action from Japanese Application No. 2017-526085, dated Mar. 30, 2018, (English Translation and Japanese Version), pp. 1-10.

\* cited by examiner

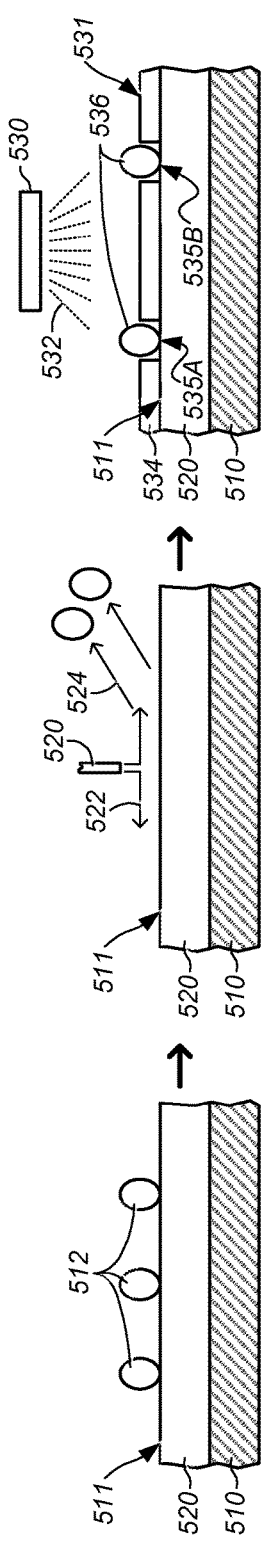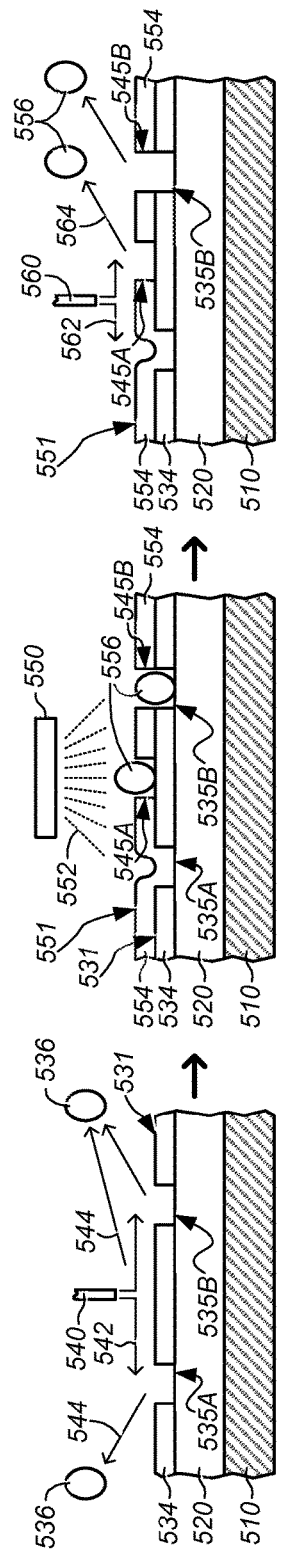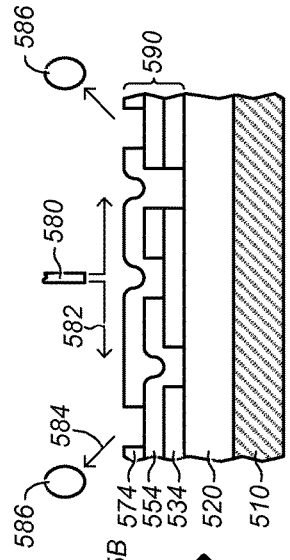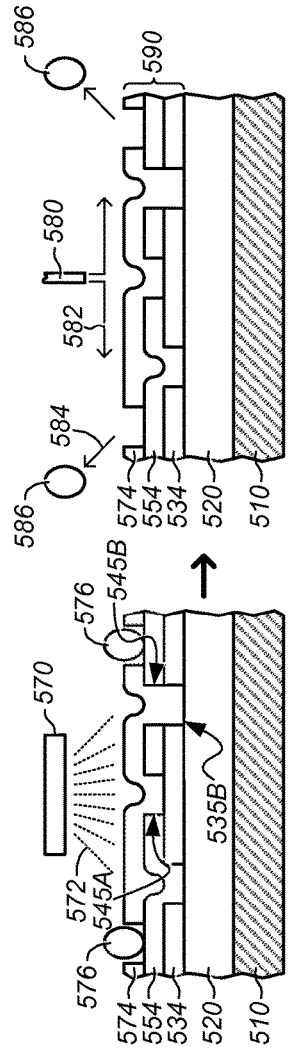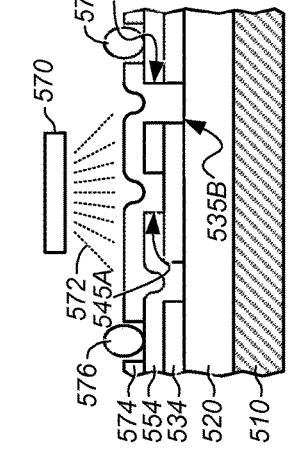

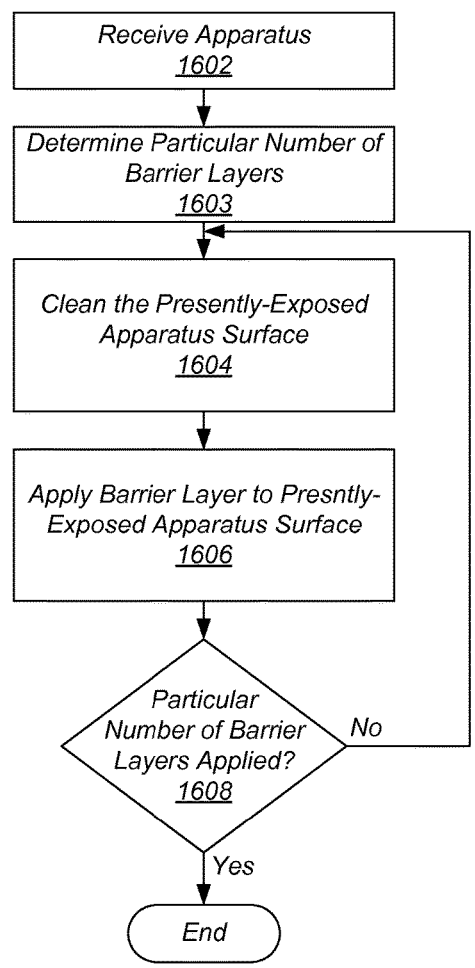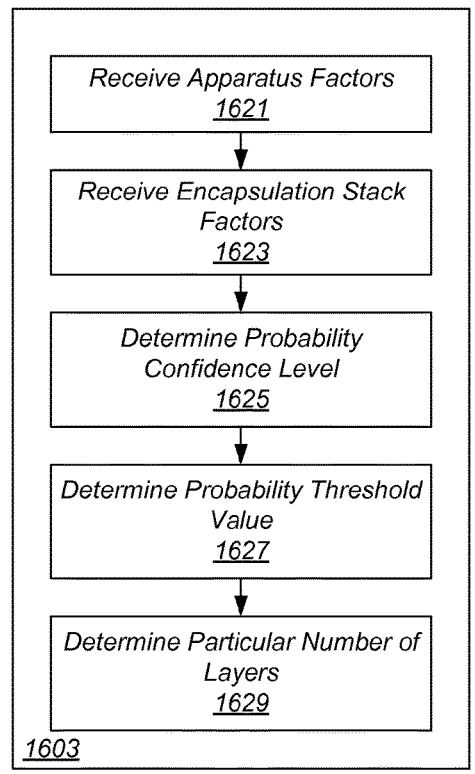
FIG. 16A
FIG. 16B

MULTIPLE BARRIER LAYER ENCAPSULATION STACK

PRIORITY INFORMATION

This application claims benefit of priority to U.S. Provisional Patent Application No. 62/080,796, filed Nov. 17, 2014 titled "MULTIPLE BARRIER LAYER ENCAPSULATION STACK," which is hereby incorporated by reference herein in its entirety.

BACKGROUND

Various apparatuses can include a substrate, a device provided on one or more substrates, etc. Such devices can include one or more of electrochromic (EC) devices, light emitting diodes (OLEDs), photovoltaics (PV), thin film devices, thin film battery devices, some combination thereof, etc. In some cases, an apparatus can be located in an environment which includes environmental elements which can damage or degrade the device, substrate, etc. For example, an EC device may be exposed to an ambient environment in which the ambient environment is a mixture of ambient air and water vapor. Environmental elements, which can include one or more various instances of particulate matter, precipitation, gases, liquids, solids, etc., from the ambient environment can permeate through various layers of various apparatuses, including EC devices. For example, environmental elements can include one or more of water, oxygen, some combination thereof, etc., and where an apparatus includes a EC device is sensitive to water (also referred to herein as sensitivity to "moisture"), permeation of water to the EC device can cause degradation of one or more elements of the EC device, which can result in degraded functionality of the EC device. Degraded functionality of an EC device can include a degraded structural ability of the EC device to change coloration based at least in part upon applied electric potential. Various other apparatuses, including organic light emitting diodes (OLEDs), photovoltaics (PV), thin film devices, some combination thereof, etc. can be sensitive to one or more various environmental elements.

In some cases, an apparatus is structured to include a barrier layer which provides at least some protection against environmental element permeation from the ambient environment. In some cases, an applied barrier layer is referred to as an "encapsulation layer", "encapsulation stack," or the like. Such structuring of an apparatus may be referred to as "passivating" the apparatus, and an apparatus structured to restrict environmental element permeation between environmental element-sensitive portions of the apparatus and the external environment via one or more barriers may be referred to as a "passivated" apparatus.

A barrier layer applied to an apparatus can, in some cases, include imperfections, defects, etc. which can result in permeation "pathways" through the barrier layer via which environmental elements can pass, thereby leading to environmental element permeation through the barrier layer. Such defects can result from the presence of particles on an exposed apparatus surface to which an encapsulation stack is applied. In some cases, a particle can be deposited on an exposed surface as a result of one or more portions of a barrier layer-application process.

In some cases, the presence of particles on an exposed surface can result in the formation of gaps, also referred to interchangeably herein as "gap spaces" in an applied barrier layer. Such gap space formation can result from the presence, on an exposed surface, of a particle which is substantially larger in diameter than the applied barrier layer thickness, such that the stress on portions of the barrier layer surrounding the particle result in localized weakening in adhesion of the barrier layer, which can result in localized barrier layer detachment, failure, etc. around the particle. For example, some barrier layer application processes include Atomic Layer Deposition (ALD) which provides a conformal, thin layer of a permeation-resistant material on an exposed surface. In some cases, particles present on the exposed surface prior to, or as a result of, the barrier layer application process can be substantially thicker (i.e., wider in diameter) than the thickness of the barrier layer applied via ALD, resulting in formation of a gap space in the barrier layer, where the gap space provides a permeation pathway for environmental elements to pass from an external environment to the apparatus.

BRIEF DESCRIPTION OF THE DRAWINGS

FIG. 5A-H illustrate a process of applying a multi-layer encapsulation stack on an apparatus which includes implementing a cleaning of a presently-exposed apparatus surface prior to applying each of the multiple barrier layers, according to some embodiments.

FIG. 16A illustrates applying a multi-layer encapsulation stack, according to some embodiments.

FIG. 16B illustrates determining a particular number of barrier layers to apply to establish a multi-layer encapsulation stack, according to some embodiments.

Figure 1:
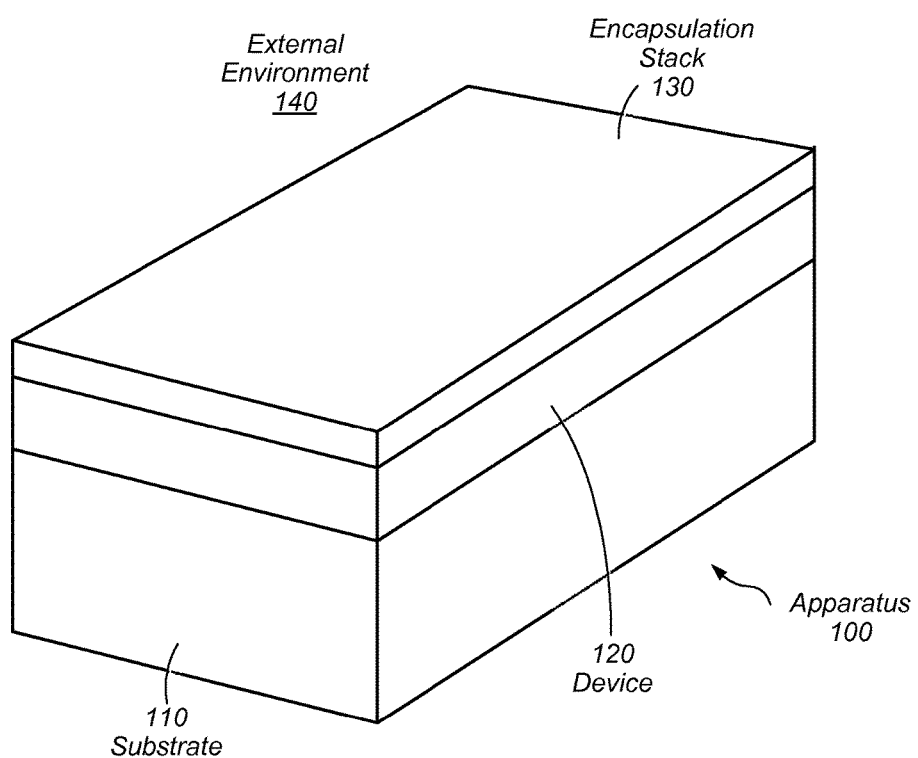
FIG. 1 illustrates a perspective view of an apparatus which comprises a substrate, a device provided on the substrate, and an encapsulation layer, applied to a substrate-distal side of the device, which passivates the apparatus against at least some environmental elements, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of an apparatus which includes a multi-layer encapsulation stack and methods for applying the multi-layer encapsulation stack to the apparatus are disclosed. An apparatus can include one or more of a substrate, a device provided on the substrate, etc. The multi-layer encapsulation stack can include multiple consecutively-applied barrier layers, where each individual barrier layer is structured to resist environmental element permeation through the respective barrier layer. An encapsulation stack can include one or more various types of barrier layers including, without limitation, one or more of a thin film barrier layer, a barrier layer applied via atomic layer deposition (ALD), a laminate barrier layer, a conformal barrier layer, an inorganic barrier layer, some combination thereof, etc. A barrier layer which is structured to resist environmental element permeation can include a barrier layer which is structured to resist permeation of one or more various environmental elements through the respective barrier layer. Environmental elements can include one or more of specific elements, molecules, substances, etc. which can be present in an external environment, relative to an apparatus to which an encapsulation stack is applied. In some embodiments, environmental elements include one or more of any substances, molecules, atomic elements, etc. which can be present in an ambient environment, including any particulate matter, gases, liquids, atmospheric precipitation, substances included as vapor in an environment, some combination thereof, etc. For example, an environmental element, as referred to herein, can include one or more various substances including, without limitation, oxygen, water, water included as vapor in ambient air (also referred to as "humidity", "moisture", etc.), some combination thereof, etc.

In some embodiments, the encapsulation stack is applied via a process which includes applying each of the separate barrier layers of the multi-layer encapsulation stack consecutively, where each separate barrier layer application of a separate barrier layer is preceded by a cleaning of the presently-exposed apparatus surface to which the barrier layer is to be applied. A presently-exposed apparatus surface can include a particular surface of one or more portions of the apparatus, including an exposed surface of one or more of a substrate, exposed surface of a device provided on the substrate, some combination thereof, etc. An exposed surface of a device provided on the substrate can include an exposed substrate-distal surface of the device.

In some embodiments, the presently-exposed apparatus surface to which a barrier layer is to be applied, and which is cleaned prior to said application, can include an exposed surface of one or more barrier layers which were previously applied to the apparatus. For example, where an encapsulation stack includes two consecutively-applied barrier layers, a process via which the encapsulation stack is applied can include cleaning an exposed apparatus surface prior to applying the first barrier layer to the exposed apparatus surface and subsequently applying the first barrier layer, such that the apparatus comprises a presently-exposed apparatus surface which includes an exposed surface of the first barrier layer. The presently-exposed apparatus surface which includes the exposed surface of the first barrier layer can be cleaned prior to application of the second barrier layer, and the second barrier layer can be subsequently be applied to the presently-exposed apparatus surface. Cleaning a presently-exposed apparatus surface, as described herein, can include implementing one or more particular cleaning processes on at least a portion of a presently-exposed apparatus surface.

In some embodiments, cleaning the presently-exposed apparatus surface prior to application of a particular barrier layer to the presently-exposed apparatus surface, where another barrier layer was previously applied to the apparatus and the presently-exposed apparatus surface includes an exposed surface of the previously-applied "other" barrier layer, can be referred to as interposing consecutive barrier layer applications with a cleaning of the presently-exposed apparatus surface, cleaning a presently-exposed apparatus surface between consecutive barrier layer applications, some combination thereof, etc.

In some embodiments, cleaning the presently-exposed apparatus surface prior to each of the barrier layer applications, between consecutive barrier layer applications, etc. results in an encapsulation stack which comprises multiple consecutively-applied barrier layers where the encapsulation stack is at least partially free from continuous permeation pathways via which environmental elements can permeate from an external environment to the apparatus through the encapsulation stack. The cleaning of the presently-exposed apparatus surface prior to, between, etc. consecutive barrier layer applications can result in each applied barrier layer filling in at least some of any gap spaces present in a previously-applied barrier layer, thereby sealing off potential permeation pathways through the stack, formed from gap spaces in the individual barrier layers, through which environmental elements could permeate between an external environment and an apparatus to which the stack is applied.

Such a resulting encapsulation stack can protect environmental element-sensitive portions of the apparatus from environmental elements. Furthermore, the encapsulation stack can include a relatively low thickness, relative to encapsulation stacks which include organic layers which restrict environmental element permeation through a stack by coating particles, creating tortuous permeation pathways through the stack, etc. In addition, the process via which the encapsulation stack is applied can have relaxed cleanliness requirements, relative to a process which applies one layer, a process which applies multiple layers without cleaning prior to, between, etc. applying each of the multiple barrier layers, as defects in a given applied barrier layer can be mitigated by a subsequently-applied barrier layer.

For example, in some embodiments, an encapsulation stack includes multiple barrier layers which each comprise an inorganic barrier layer, where the barrier layer comprises an inorganic material structured to resist environmental element permeation through the material. In some embodiments, the multi-layer structure of the encapsulation stack includes consecutive barrier layers comprising alternating high/low refractive index materials, e.g. $Si_3N_4/SiO_2$, can be applied by e.g., a meta mode process (sputtering). This process can require very clean surfaces with minimal particles that could contribute to pathways for environmental element permeation through the film.

In some embodiments, adhesion of the stack to apparatus surfaces, and minimized compressive stress in the stack (e.g., <600 MPa) can result in added durability of the stack in restricting environmental element permeation over time. Dense amorphous alternating organic and inorganic layered stacks can be applied by PECVD methods. These films can be highly adherent with reduced defects due to the amorphous, conforming film properties. Dense reduced defect multilayer coatings can also be applied by Atomic Layer Deposition (ALD) techniques.

In some embodiments, an encapsulation stack includes a particular number of barrier layers, where the number of layers is predetermined based on various factors, including one or more of the materials included in each of the layers, the surface area of the apparatus covered by the encapsulation stack, the estimated distribution and size of particles present on an exposed surface preceding and following each barrier layer application, an estimated number, distribution, and size of gap spaces present in each individual barrier layer upon application of the given barrier layer, some combination thereof, etc. Based on one or more of the factors, a probability can be determined, at one or more particular confidence levels, that an encapsulation stack comprising a given number of barrier layers will not include any more than a certain number of continuous permeation pathways through the stack, via aligned gap spaces in the various individual barrier layers. The particular number of layers can be determined based on a minimum number of layers at which the determined probability, at a particular confidence level, that the resulting encapsulation stack includes at least a certain minimum number of pathways through the stack is less than a threshold value. In another example, the particular number of layers can be determined based on a minimum number of layers at which the determined probability, at a particular confidence level, that the resulting encapsulation stack includes no more than a certain minimum number of pathways through the stack is greater than a threshold value.

As used herein, "configuring" an apparatus, barrier layer, device, system, process, etc. can be referred to interchangeably as "structuring" same. An apparatus, barrier layer, device, system, process, etc. which is "configured to" do something can be referred to interchangeably as an apparatus, barrier layer, device, system, process, etc. which is "structured" to do something, "structurally configured" to do something, etc.

I. Encapsulation Stack Protection of an Apparatus

FIG. 1 illustrates a perspective view of an apparatus which comprises a substrate, a device provided on the substrate, and an encapsulation layer, applied to a substrate-distal side of the device, which passivates the apparatus against at least some environmental elements, according to some embodiments. Apparatus 100 includes a substrate 110, a device 120 provided on a surface of the substrate, and an encapsulation stack 130 applied to a substrate-distal surface of the device 120.

In some embodiments, the device 120 includes an electrochromic (EC) device. The EC device can include an EC film stack and conductive layers on opposite sides of the EC film stack. An EC film stack, as referred to herein, can include a counter-electrode (CE) layer, an electrochromic (EC) layer, and an ion conducting (IC) layer between the two. In some embodiments, one of the CE layer or the EC layer is structured to reversibly insert ions such as cations, including one or more of H+, Li+, D+, Na+, K+ or anions, including one or more of OH—, especially made of an anodic (or respectively cathodic) electrochromic material; and the other of the CE layer or the EC layer is structure to reversibly inserting said ions, especially made of a cathodic (or respectively anodic) electrochromic material. The IC layer, in some embodiments, is structured to include an electrolyte layer. The EC film stack may be characterized in that at least one of the CE layer or the EC layer may be structure to reversibly insert said ions, including layer made of an anodic or cathodic electrochromic material, has a sufficient thickness to allow all the ions to be inserted without electrochemically disfunctioning said active layers, in that the IC layer having an electrolyte function comprises at least one layer based on a material chosen from tantalum oxide, tungsten oxide, molybdenum oxide, antimony oxide, niobium oxide, chromium oxide, cobalt oxide, titanium oxide, tin oxide, nickel oxide, zinc oxide optionally alloyed with aluminum, zirconium oxide, aluminum oxide, silicon oxide optionally alloyed with aluminum, silicon nitride optionally alloyed with aluminum or with boron, boron nitride, aluminum nitride, vanadium oxide optionally alloyed with aluminum, and tin zinc oxide, at least one of these oxides being optionally hydrogenated, or nitrided, in that one or more of the CE layer or the EC layer comprises at least one of the following compounds: oxides of tungsten W, niobium Nb, tin Sn, bismuth Bi, vanadium V, nickel Ni, iridium Ir, antimony Sb and tantalum Ta, alone or as a mixture, and optionally including an additional metal such as titanium, rhenium or cobalt, and in that the thickness of one or more of the EC layer or the CE layer is between 70 and 250 um, between 150 and 220 um, etc.

The EC film stack can include various materials, including tungsten oxides. The CE layer can include various materials, including one or more tungsten-nickel oxides. The IC layer can include various materials including one or more silicon oxides. The charge can include various charged electrolyte species, including lithium ions. An IC layer can include a layer region, a multilayer region, an interfacial region, some combination thereof, or the like. An IC layer which includes an interfacial region can include one or more component materials of one or more of the EC or CE layer.

In some embodiments, each of the EC regions, conductive layer regions, etc. of the EC device may have the same or different sizes, volume, and/or surface areas. In other embodiments, each of the EC regions, conductive layer regions, etc. may have the same or different shapes (including curved or arcuate shapes).

In some embodiments, the device 120 can include one or more various types of devices, including one or more thin film devices, photovoltaic devices, organic light-emitting diode (OLED) devices, etc. It will be understood that the thin film devices which can be included in the device 120 can encompass any known thin film devices.

As shown, encapsulation stack 130 is located between the collective device 120 and substrate 110 and an external environment 140. An external environment, as referred to herein, can include an ambient environment, an interior environment included within the housing of a device, some combination thereof, etc. In some embodiments, one or more of device 120 and substrate 110 includes one or more environmental element-sensitive portions, also referred to herein an environmental element sensitive portions of an apparatus, and encapsulation stack 130 restricts permeation of said environmental elements between the external environment 140 and such portions, thereby protecting the apparatus 100 from damage and degradation due to environmental elements.

Figure 2:
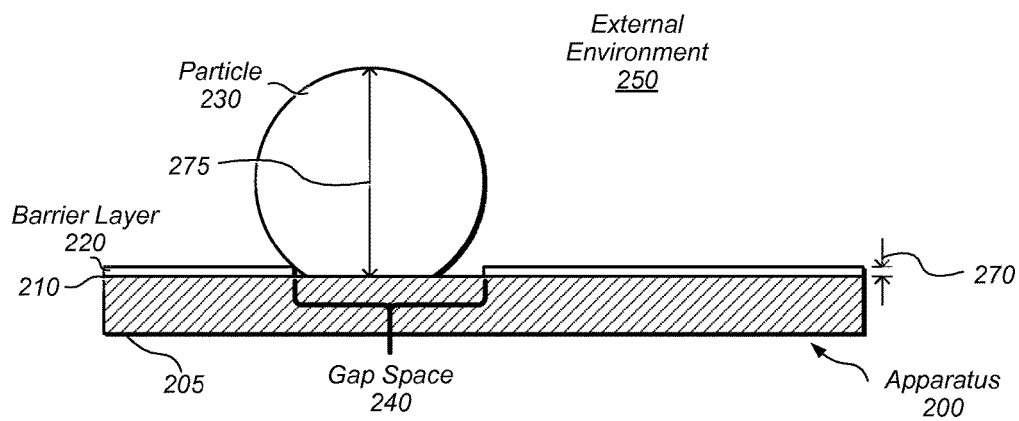
FIG. 2 illustrates a partial cross-sectional view of an apparatus with an applied barrier layer which includes a gap space defect formed as a result of a particle, according to some embodiments.

FIG. 2 illustrates a partial cross-sectional view of an apparatus with an applied barrier layer which includes a gap space defect formed as a result of a particle, according to some embodiments. Apparatus 200 can be included in any of the above embodiments. Apparatus 200 includes an apparatus surface 210 of an apparatus portion 205 and a barrier layer 220 applied to the surface 210. The barrier layer 220 can be structured to restrict environmental element permeation between the surface 210 and an external environment 250 via the layer 220.

In some embodiments, a barrier layer can be compromised, and such compromising can be referred to as an at least partial "failure" of the barrier layer, where such a comprising of the barrier layer results in a gap, gap space, etc. in the barrier layer through which environmental elements can permeate. Such a compromising of the barrier layer can be at least partially based on the presence of a particle on the apparatus surface 210 prior to application of the barrier layer 220. In some embodiments, a particle can have a diameter which is a significant proportion, a multiple, etc. of the thickness of the applied barrier layer, which can result in localized failure of the barrier layer around the particle which results in the formation of a gap space in the barrier layer.

For example, in the illustrated embodiment shown in FIG. 2, a barrier layer 220 applied to surface 210 of apparatus portion 205 has a particular thickness 270 which can be significantly less than a thickness 275 of a particle 230 on the apparatus 200. The barrier layer 220, in some embodiments, is a conformal layer which at least partially conforms to the contours of surface 210. As also shown, a particle 230 is present upon the surface 210 and is several multiples larger than the thickness of the barrier layer 220. In one non-limiting example, the barrier layer thickness 270 can be approximately 5 nanometers-100 nanometers in thickness, and the particle 5230 thickness 275 can be approximately 3000-5000 nanometers in thickness, such that the particular has an approximate thickness which is at least several times that of the barrier layer 220. It will be understood that the thicknesses of the barrier layer 220 and the particle can encompass other thicknesses. In some embodiments, where particle 230 is present on surface 210 at the time of application of layer 220 on surface 210, the application process fails to apply the layer 220 in a space around the particle 230, resulting in the formation of a gap space 240 in the layer 220. The particle may not be affixed to the surface 210 and may subsequently move from its illustrated position, thereby exposing the gap space 240 to the external environment and enabling environmental element permeation between the environment 250 and the apparatus 200 via a permeation pathway which comprises the gap space 240. In some embodiments, where the layer 220 is conformal, the layer 220 can be applied around and over particle 230. However, based at least in part upon the substantial size of the particle 230 relative to the thickness of the layer 220, the contours in the layer 220 over the particle 230 can result in relatively high stresses on the layer 220 which can result in eventual localized failure of the layer 220 around the particle 230, resulting in formation of the gap space 240.

In some embodiments, apparatus 200 includes one or more environmental element-sensitive portions which can be damaged, degraded, etc. by environmental elements permeating through gap spaces 240 in layer 220 from the environment 250. For example, apparatus 200 can include a device provided on a substrate, including an electrochromic device, OLED, etc., where the surface 210 comprises a surface of the device, and where at least portion of the device to which environmental elements can permeate from environment 250 through gap space 240 can be sensitive to said environmental elements, the presence of the gap space 240 can result in damage, degradation, failure, etc. of the device.

Figure 3:
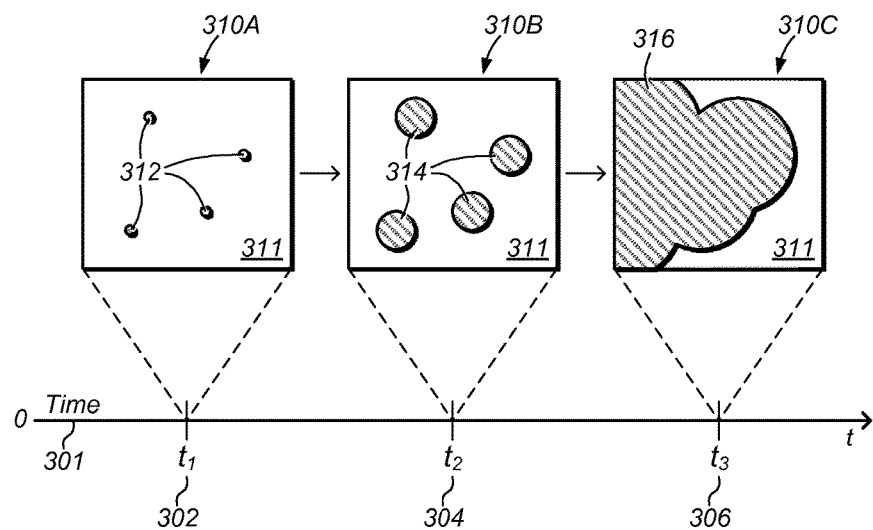
FIG. 3 illustrates multiple views of progressive degradation of an apparatus over time, as a result of gap spaces in a barrier layer applied to the apparatus, according to some embodiments.

FIG. 3 illustrates multiple views of progressive degradation of an apparatus over time, as a result of gap spaces in a barrier layer applied to the apparatus, according to some embodiments. Apparatus 310 can be included in any of the above embodiments.

In some embodiments, an apparatus which includes portions that are sensitive to environmental elements can be degraded over time based on permeation of the environmental elements through one or more gap spaces in one or more barrier layers applied to the apparatus. In some embodiments, such degradation can propagate throughout a substantial proportion of the apparatus from a relatively small number of gap spaces, which can result in partial or total failure of the apparatus.

In the illustrated embodiment, for example, several views of an apparatus 310 are presented at separate points along a timeline 301, where the apparatus 310 includes an environmental element-sensitive device 311. The illustrated embodiment illustrates progressive propagation of degradation of the apparatus over time based at least in part upon gap spaces in one or more barrier layers applied to the apparatus 310.

The illustrated timeline 301 illustrates the progression of time "t" from a point in time t=0, where t=0 at the point in time at which a barrier layer is applied to an exposed surface of apparatus 310 and where the barrier layer comprises four gap spaces.

As shown at the first timestamp "$t_1$" 302, the apparatus 310A, at $t_1$, includes a functional region 311 which is undamaged and structured to perform a function and four distinct degraded regions 312 which are nonfunctional relative to region 311. For example, where apparatus 310 comprises an OLED device which is sensitive to one or more environmental elements, region 311 can comprise a region of the OLED which can emit light and regions 312 can be at least partially degraded relative to region 312, such that the portions of the OLED within regions 312 can be at least partially unable to emit light, based at least in part upon degradation of the regions 312 due to environmental element permeation. The four regions 312 can each be associated with a separate gap space in a corresponding one or more barrier layers (not shown in FIG. 3) applied to the apparatus 310, where environmental elements are able to permeate from an external environment to four separate points on apparatus 310 via four separate pathways through the one or more barrier layers. Each separate region 312 can encompass an initial point at which environmental elements reach the apparatus 310 via a separate pathway through the one or more barrier layers.

As shown at the second timestamp "$t_2$" 304, the apparatus 310B, at $t_2$, includes degraded regions 314 which have expanded in size, relative to the regions 312 at time $t_1$. Because environmental elements can permeate through the one or more barrier layers to the apparatus 310 at points within regions 312, the environmental elements can subsequently permeate through the apparatus itself, such that the degraded regions 312 can expand over time to encompass greater proportions of the apparatus 310. As a result, as shown at time 304, the apparatus 310B includes a functional region 311 which is smaller relative to time 302, and the four separate degraded regions 314 are expanded.

As shown at the third timestamp "$t_3$" 306, the apparatus 310C, at $t_3$, includes degraded regions which have further expanded in size, such that the four separate regions 314 have merged into a single degraded region 316 which encompasses a majority of the apparatus 310C, relative to the functional region 311. Such expansion of the degraded regions, based at least in part upon environmental element permeation through the apparatus 310, can result in substantial degradation of the overall apparatus 310, such that the apparatus can be considered to be at least partially nonfunctional. For example, where apparatus 310 includes an OLED, and where degraded regions 316 are unable to emit light, relative to functional region 311, the degradation of the OLED as shown at time 306 can constitute a substantial loss of functionality of the OLED, such that the OLED may be considered to have lost useful functionality.

In some embodiments, the progressive degradation of the apparatus 310 shown in FIG. 3 can occur over a relatively short period of elapsed time. For example, in some embodiments, where the apparatus 310 is at least partially sensitive to oxygen, degradation regions resulting from oxygen permeation through individual gap spaces in a barrier layer applied to apparatus 310 can become noticeable to unaided human visual observation within a period of days of exposure to oxygen.

In some embodiments, an encapsulation stack can include multiple layers, which can include one or more barrier layers, and is structured to provide augmented protection from environmental elements to an apparatus, relative to a single barrier layer.

Figure 4A:
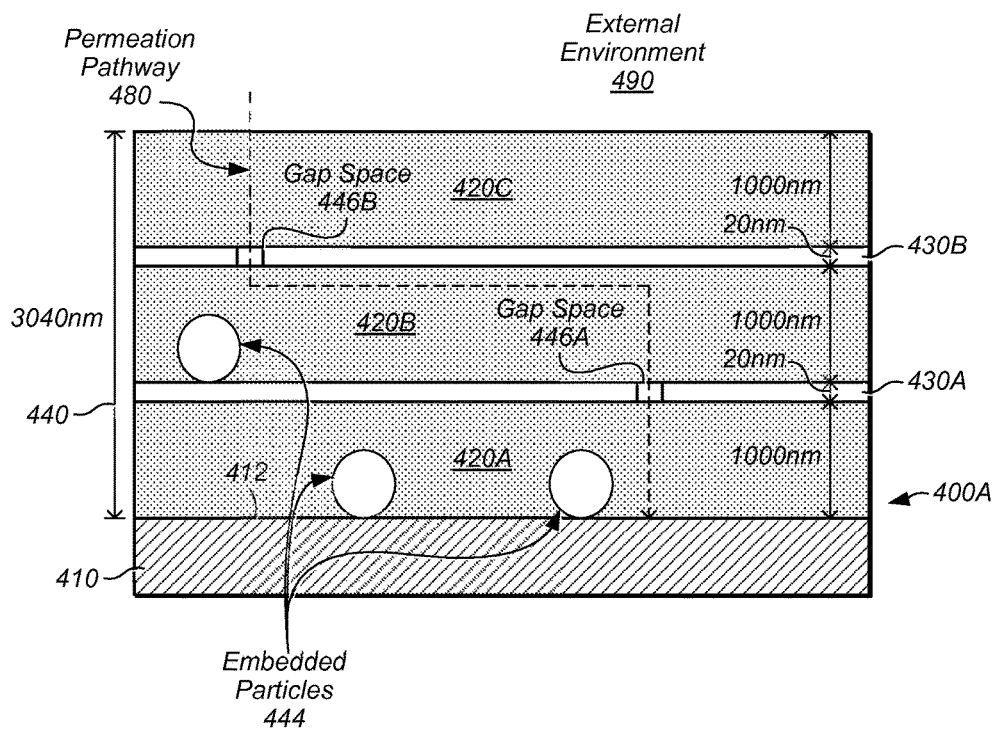
FIG. 4A illustrates a partial cross-sectional view of an apparatus which includes an multi-layer encapsulation stack which is structured to include alternating conformal and permeation-resistant layers, according to some embodiments.
Figure 4B:
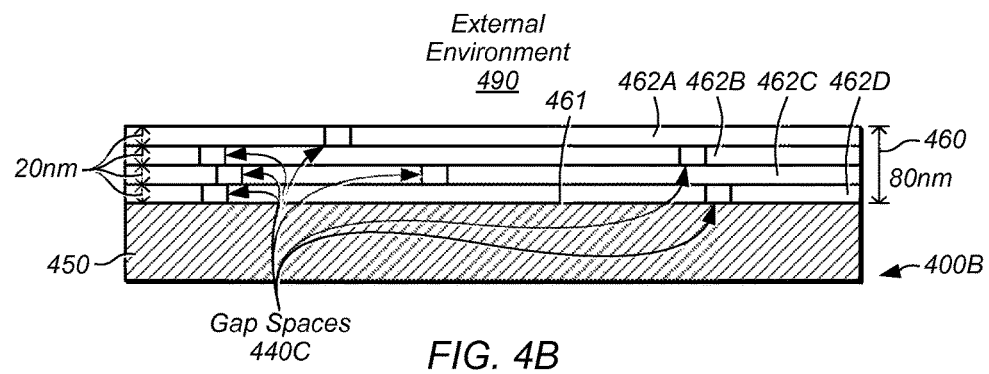
FIG. 4B illustrates a partial cross-sectional view of an apparatus which includes a multi-layer encapsulation stack which is structured to include multiple consecutive permeation-resistant layers, according to some embodiments.

FIG. 4A-B illustrate partial cross-sectional views of apparatuses which each include a multi-layer encapsulation stack. FIG. 4A illustrates a partial cross-sectional view of an apparatus which includes an multi-layer encapsulation stack which is structured to include alternating conformal and permeation-resistant layers, according to some embodiments. FIG. 4B illustrates a partial cross-sectional view of an apparatus which includes a multi-layer encapsulation stack which is structured to include multiple consecutive permeation-resistant layers, according to some embodiments. Each of the apparatuses 400A, 400B illustrated in FIG. 4A-B can be included, separately or in combination, in any of the above embodiments.

In some embodiments, an encapsulation stack includes a multi-layer stack comprising alternating organic/inorganic layers including an organic layer, which can include a polymer, monomer including an acrylate, etc. and inorganic barrier layer structured to restrict environmental element permeation, such as a layer comprising $SiO_2$ or $Al_2O_3$. A barrier layer can include multiple subsequently deposited dyads to achieve low moisture penetration rates. Such a stack relaxes the particulate contamination requirement and reduces the probability of pathways through the complete encapsulation stack. Application of the stack to an apparatus is performed in vacuum, and the organic layer can be applied as a liquid and rapidly cured. The next deposition can include the inorganic barrier layer, etc. The organic layer can be conformal and can "coat" defects conformally and prevent defects, including gap spaces in one or more barrier layers, from propagating directly through the stack. The resulting pathway for environmental elements through the stack can be very torturous, such that the permeation rate can be reduced.

In some embodiments, an encapsulation stack, including a VITEX™, is formed on a thin polymer substrate, which can include PET. This stack can then be laminated to an apparatus using one or more various adhesives, including silicone adhesives, other "dry" adhesives such as SENTRY-GLAS™, etc.

FIG. 4A illustrates an apparatus 400A which includes an apparatus portion 410, having a surface 412, to which an encapsulation stack 440 is applied, where the stack 440 includes alternating organic layers 420A-C and inorganic barrier layers 430A-B. As shown, the organic layers 420A-C is each conformal and can "coat" particles 444 present on a surface 412 upon which the given organic layer is applied. For example, where particles 444 are present on surface 410, layer 420A, when applied to surface 410, coats the particles 444 such that the particles are embedded within the layer 420A. In addition, as shown, each layer 420A-C has sufficient thickness that the individual layers have a smooth exposed surface when applied, so that a subsequently-applied inorganic layer 430 is applied on a smooth surface. As further shown, where the application of an inorganic layer 430A results in a particle 444 being present on an exposed surface of the layer 430A, a subsequently applied organic layer 420B conformally coats the particle and embeds it within the layer 420B.

As further shown, although the individual barrier layers 420A-B each include respective gap spaces 446A-B in the respective layers 430A-B, the continuous permeation pathway 480 which environmental elements can follow through the stack 440 to permeate from environment 490 to apparatus surface 412 is relatively tortuous, based at last in part upon the presence of multiple barrier layers 430A-B and the thickness of the organic layers 420 bounding the alternating barrier layers 430. Although the organic layers 420A-C may be permeable by the environmental elements, the relatively increased length and winding of the permeation pathway 480 at least partially restricts, or at least impedes, the permeation of environmental elements along pathway 480. Furthermore, the organic layers 420 can "fill in" defects in a given exposed surface, including gap spaces, particles, etc. so that such defects do not affect a subsequently-applied barrier layer.

In some embodiments, an encapsulation stack which includes alternating barrier and organic layers can be substantially thicker than an encapsulation stack which does not include organic layers. Such thickness can be based in part upon the use of the organic layers to coat and embed defects, including particles, within the given organic layers. For example, as shown, where each individual barrier layer 430A-B is approximately 20 nm thick, each organic layer is approximately 1000 nm thick. As a result, organic layers 420A-B embed particles 444 which are substantially larger than the thickness of barrier layers 430A-B while still providing smooth exposed surfaces 412 upon which subsequent barrier layers can be applied. As a result, the encapsulation stack 440 has an overall thickness of 3040 nm. In some embodiments, an encapsulation stack 440 which includes the alternating organic and inorganic barrier layers can be at least partially susceptible to stresses from flexing of the apparatus 410, including one or more of compression stresses or tension stresses, based at last in part upon the thickness of the stack 440.

FIG. 4B illustrates an apparatus 400B which includes an encapsulation stack 460 applied to a surface 461 of an apparatus portion 450. The encapsulation stack 460 includes four consecutive barrier layers 462A-D which each have an approximate thickness of 20 nm, such that the overall encapsulation stack 460 has an approximate thickness of 80 nm.

As shown in FIG. 4B, each individual barrier layer 462 can include individual defects specific to the individual barrier, and the multiple barrier layers in the stack can collectively restrict environmental element permeation through individual defects of the individual layers. Such collective restriction can be based on the stack 460 being structured such that individual defects of individual barrier layers are precluded from collectively establishing a permeation pathway through the entire stack 460. For example, in the illustrated embodiment of FIG. 4B, each layer 462A-D includes at least one gap space 440C, and while gap spaces in each of layers 462B-D collectively establish a pathway through a portion of the stack 460, extending from surface 461, the gap spaces 440C in layer 462A does not align with the gap spaces in layers 462B-D, such that the pathway does not extend through layer 462A to the environment 490. As a result, the individual gap spaces 440C in layers 462A-D do not establish a permeation pathway through stack 460. In addition, the thickness of the stack 460 in FIG. 4B is substantially less than that of the stack 440 in FIG. 4A, as organic layers 420 are not applied in stack 460 to coat and embed particles.

In some embodiments, the individual barrier layers 462A-D of stack 460 are applied consecutively to form stack 460. The presence of particles on a presently-exposed apparatus surface to which a barrier layer is to be applied can result in the layer becoming compromised. As noted with regard to FIG. 2, a particle can be substantially larger than the thickness of an individual barrier layer. In the illustrated embodiment of FIG. 4B, even a single particle with a diameter, or "thickness", of approximately 100 nm can have a diameter greater than the thickness of the entire stack 460.

In some embodiments, application of a stack 460 which restricts permeation between environment 490 and apparatus portion 460 can include removal of particles from surface 461 via implementation of a cleaning process upon surface 461, where the cleaning process removes particles from surface 461. In some embodiments, the process of applying a barrier layer to a presently-exposed apparatus surface can result in one or more particles being present in the applied layer, where the one or more particles result in the formation of one or more gap spaces in the applied layer, even though the barrier layer is applied upon a surface 461 which has been previously cleaned of particles via a cleaning process. Subsequently-applied barrier layers can at least partially fill in gap spaces of a given exposed surface, and a cleaning process implemented on the exposed surface, even an exposed surface of an applied barrier layer, can result in an exposed surface upon which a subsequent barrier layer can be applied. In some embodiments, each individual barrier layer 462A-D of an encapsulation stack 460 can include one or more individual defects, but the stack 460 can include a sufficient number of barrier layers 462A-D to preclude the existence of at least a certain number of continuous permeation pathways, formed via aligned gap spaces, through each and every barrier layer in the stack, thereby restricting environmental element permeation through the stack. In some embodiments, the certain number of continuous pathways is 1 (one), such that the stack includes a sufficient number of barrier layers to preclude the existence of any continuous permeation pathways through the stack.

FIG. 5A-H illustrate a process of applying a multi-layer encapsulation stack on an apparatus which includes implementing a cleaning of a presently-exposed apparatus surface prior to applying each of the multiple barrier layers, according to some embodiments. The process can be applied with regard to any of the apparatuses included in any of the embodiments included herein.

In the illustrated embodiment of FIG. 5A-H, the apparatus initially comprises a substrate 510 and a device 520 provided on at least a portion of the substrate 510 and an encapsulation stack 590 is applied to the apparatus in a sequence of consecutive steps. The illustrated portion of the apparatus in FIG. 5A-H includes the device 520 provided upon an entirety of the visible substrate 510. It will be understood that some portions of the apparatus include portions of the substrate 510 not covered by the device 520.

FIG. 5A illustrates the apparatus prior to application of the stack 590. Device 520 is provided on substrate 510. As shown, several particles 512 are present on an exposed surface 511 of the device 520, where the exposed surface 511 is comprised in the exposed apparatus surface. In FIG. 5A, surface 511 is a presently-exposed apparatus surface.

FIG. 5B illustrates cleaning the presently-exposed apparatus surface 511 via implementation of a cleaning process on the presently-exposed apparatus surface 511. The cleaning process, when implemented on surface 511, removes 524 at least a portion of the particles 512, such that surface 511 is at least partially cleaned of particles. In the illustrated embodiment of FIG. 5B, the cleaning process which is implemented comprises a jet of fluid 522, directed by a fluid source device 520 to impinge on the surface 511, where the fluid 522 carries the particles 512 away from surface 511. The fluid 522 can include any known cleaning fluid, including one or more solvents, and can include fluid in one or more states, including gaseous, liquid, some combination thereof, etc.

It will be understood that, while the cleaning processes illustrated in FIG. 5A-H are shown to include fluid jet cleaning processes, each of the cleaning processes implemented in FIG. 5A-H can encompass any known cleaning process and is not limited to fluid jet cleaning processes.

FIG. 5C illustrates application of a barrier layer 534 on surface 511. A barrier layer 534 can be applied via any known barrier layer application process. The illustrated process shows an applicator 530 providing the material 532 of the barrier layer 534 to coat the presently-exposed surface 511 to form the layer 534. In some embodiments, the barrier layer includes a thin film barrier applied via a "sputtering" process. In some embodiments, the barrier layer includes a thin film barrier applied via an atomic layer deposition process. Other barrier layer application processes will be understood to be encompassed.

As shown in FIG. 5C, although surface 511 was cleaned of particles 512 via implementation of a cleaning process in FIG. 5B, the application of barrier layer 564 at FIG. 5C results in a barrier layer 534 which includes particles 536, where the particles 536 result in defects in the barrier layer 534; including gap spaces 535A-B. Such particles 536 can be deposited on the apparatus as a side effect of the application of the barrier layer 534. For example, the cleanliness restrictions of the application at FIG. 5C can be sufficiently lax that particles 536 can be deposited on the apparatus via the stream 532 of material provided from the applicator 530 onto surface 511. As shown in FIG. 5C, the particles 536 can be sufficiently large in diameter to result in gap spaces 535A-B which extend through the entirety of applied barrier layer 534.

As shown in FIG. 5C, application of the barrier layer 534 results in a new presently-exposed surface 531 of the apparatus, where the surface 531 includes an exposed surface of the applied barrier layer 534.

FIG. 5D illustrates cleaning the presently-exposed apparatus surface 531 via implementation of a cleaning process on the presently-exposed apparatus surface 531. The cleaning process implemented on surface 531 in FIG. 5D can be similar to the process implemented on surface 511 in FIG. 5B, different, some combination thereof, etc. The cleaning process, when implemented on surface 531, removes 544 at least a portion of the particles 536, such that surface 531 is cleaned of particles. In the illustrated embodiment of FIG. 5D, the cleaning process which is implemented comprises a jet of fluid 542, directed by a fluid source device 540 to impinge on the surface 531, where the fluid 542 carries the particles 536 away from surface 531. The fluid 542 can include any known cleaning fluid, including one or more solvents, and can include fluid in one or more states, including gaseous, liquid, some combination thereof, etc.

As shown in FIG. 5D, implementation of the cleaning process on surface 531 results in exposing the gap spaces 535A-B. Because the exposed gap spaces expose portions of surface 511, the presently-exposed apparatus surface in FIG. 5D includes the exposed surface 511 and corresponding portions of surface 511 exposed by the gap spaces 535A-B. A subsequently-applied barrier layer can fill in one or more of the gap spaces, thereby sealing the gap space and precluding environmental element permeation through the one or more gap spaces.

FIG. 5E illustrates application of a barrier layer 554 on the presently-exposed apparatus surface shown in FIG. 5D. A barrier layer 554 can be applied via any known barrier layer application process. The illustrated process shows an applicator 550 providing the material 552 of the barrier layer 554 to coat the presently-exposed surface 531, 511 to form the layer 554. In some embodiments, the barrier layer includes a thin film barrier applied via a "sputtering" process. In some embodiments, the barrier layer includes a thin film barrier applied via an atomic layer deposition process. Other barrier layer application processes will be understood to be encompassed.

As shown in FIG. 5E, the applied barrier layer 554 fills in the gap space 535A. As barrier layer 554, like layer 534, is comprised of environmental element permeation-resistant material, the filling in of gap space 535A seals the gap space 535A from permitting environmental element permeation through the gap space 535A.

As shown in FIG. 5E, although surface 531 was cleaned of particles 536 via implementation of a cleaning process in FIG. 5D, so that gap spaces 535A-B were exposed, the application of barrier layer 554 at FIG. 5E results in a barrier layer 554 which includes particles 556, where the particles 556 result in defects in the barrier layer 554; specifically gap spaces 545A-B. Such particles 556 can be deposited on the apparatus as a side effect of the application of the barrier layer 554. In addition, as shown, one of the gap spaces 545B formed by a particle 556 aligns with gap space 535B, such that a permeation pathway from device 520 through both layers 534, 554 is present.

As shown in FIG. 5C, application of the barrier layer 534 results in a new presently-exposed surface 551 of the apparatus, where the surface 551 includes an exposed surface of the applied barrier layer 554.

FIG. 5F illustrates implementation of a cleaning process on the presently-exposed apparatus surface 551. The cleaning process implemented on surface 551 in FIG. 5E can be similar to the process implemented on surface 511 in FIG. 5B and surface 531 in FIG. 5D, different, some combination thereof, etc. The cleaning process, when implemented on surface 551, removes 564 at least a portion of the particles 556, such that surface 551 is cleaned of particles. In the illustrated embodiment of FIG. 5F, the cleaning process which is implemented comprises a jet of fluid 562, directed by a fluid source device 560 to impinge on the surface 551, where the fluid 562 carries the particles 556 away from surface 551. The fluid 562 can include any known cleaning fluid, including one or more solvents, and can include fluid in one or more states, including gaseous, liquid, some combination thereof, etc.

As shown in FIG. 5F, implementation of the cleaning process on surface 551 results in exposing the gap spaces 545A-B. Because the exposed gap spaces expose portions of surface 531 and surface 511, the presently-exposed apparatus surface in FIG. 5F includes the corresponding portions of surfaces 531, 511 exposed by the gap spaces 545A-B. A subsequently-applied barrier layer can fill in one or more of the gap spaces, thereby sealing the gap space and precluding environmental element permeation through the one or more gap spaces.

FIG. 5G illustrates application of a barrier layer 574 on the presently-exposed apparatus surface shown in FIG. 5F. A barrier layer 574 can be applied via any known barrier layer application process. The illustrated process shows an applicator 570 providing the material 572 of the barrier layer 574 to coat the presently-exposed surface, which includes surfaces 551, 531, 511 to form the layer 574. In some embodiments, the barrier layer includes a thin film barrier applied via a "sputtering" process. In some embodiments, the barrier layer includes a thin film barrier applied via an atomic layer deposition process. Other barrier layer application processes will be understood to be encompassed.

As shown in FIG. 5G, the applied barrier layer 574 fills in the gap spaces 545A-B and 535B. As barrier layer 574, like layers 554, 534, is comprised of environmental element permeation-resistant material, the filling in of gap spaces 545A-B, 535A seals the gap spaces from permitting environmental element permeation through the gap space 535A. Furthermore, as shown in FIG. 5G, because all gap spaces exposing surface 511 are filled, no permeation pathways between surface 511 of the device 520 and an external environment are present.

FIG. 5H illustrates cleaning the presently-exposed apparatus surface via implementation of a cleaning process on the presently-exposed apparatus surface resulting from the applied barrier layer 574. The presently-exposed apparatus surface includes exposed surfaces of layer 574 and layer 554. The cleaning process implemented on the presently-exposed surface in FIG. 5H can be similar to the process implemented on surface 511 in FIG. 5B and surface 531 in FIG. 5D, different, some combination thereof, etc. The cleaning process, when implemented on the surface, removes 584 at least a portion of the particles 586, such that the surface is cleaned of particles. In the illustrated embodiment of FIG. 5H, the cleaning process which is implemented comprises a jet of fluid 582, directed by a fluid source device 580 to impinge on the surface, where the fluid 582 carries the particles 586 away from the presently-exposed surface. The fluid 582 can include any known cleaning fluid, including one or more solvents, and can include fluid in one or more states, including gaseous, liquid, some combination thereof, etc.

In some embodiments, the cleaning process illustrated in FIG. 5H can be absent, at least because no continuous permeation pathways through the stack 590 are present.

Figure 6:
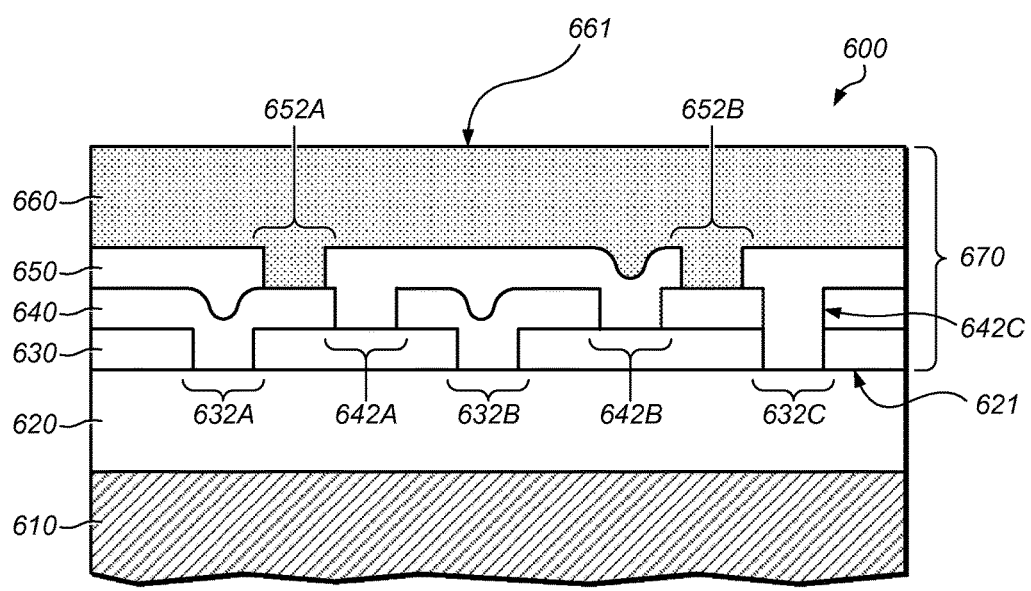
FIG. 6 illustrates a partial cross-sectional view of an apparatus which includes a multi-layer encapsulation stack which is structured to include multiple consecutively-applied permeation-resistant layers with cleaning of the presently-exposed apparatus surface prior to each layer application, according to some embodiments.

FIG. 6 illustrates a partial cross-sectional view of an apparatus which includes a multi-layer encapsulation stack which is structured to include multiple consecutively-applied permeation-resistant layers with cleaning of the presently-exposed apparatus surface prior to each layer application, according to some embodiments. One or more of the apparatus, encapsulation stack, etc. can be included in any of the embodiments herein.

Apparatus 600 includes a substrate 610, a device 620 provided on the substrate, and an encapsulation stack 670 applied on the apparatus, where the encapsulation stack 670 is applied to at least a substrate-distal surface 621 of the device 620.

In some embodiments, an encapsulation stack applied via consecutive barrier layer applications, where each barrier layer application is preceded by implementing a cleaning process on the presently-exposed apparatus surface, results in a multi-layer stack where one or more individual barrier layers include one or more gap spaces, where the gap spaces are filled by one or more subsequently-applied barrier layers. As a result, individual defects in individual barrier layers can be mitigated by other barrier layers, such that the multiple barrier layers in the stack do not include a continuous permeation pathway between environmental-element sensitive portions of the apparatus, including a device, and an external environment, through the encapsulation stack. Such mitigation can be based at least in part upon implementing a cleaning process on the presently-exposed apparatus surface prior to each barrier layer application, interposed between consecutive barrier layer applications, some combination thereof, etc.

For example, as shown in FIG. 6, encapsulation stack 670 includes three separate and consecutively-applied barrier layers 630, 640, 650, where each individual barrier layer includes multiple gap spaces. Layer 630 includes three gap spaces 632A-C, layer 640 includes three gap spaces 642A-C, and layer 650 includes two gap spaces 652A-B. As shown, the applied barrier layer 640 fills in the gap spaces 632A-B of layer 630, thereby sealing those gap spaces 632A-B from forming part of a pathway between device 620 and an external environment through the stack 670. In addition, layer 650 fills in gap spaces 642A-C of layer 640.

In some embodiments, at least some gap spaces of adjacent barrier layers in an encapsulation stack may align, also referred to herein as the gap spaces of the adjacent barrier layers "overlapping", such that the gap spaces, if not filled in, can form a continuous permeation pathway through at least the adjacent layers. In some embodiments, the encapsulation stack includes a sufficient number of barrier layers that the probability that at least a minimum number of continuous permeation pathways extend through all of the barrier layers in the stack is less than a threshold value, for one or more particular confidence levels. For example, in the illustrated embodiment, three barrier layers 630, 640, 650 may have been consecutively applied to apparatus 600, with cleaning processes implemented on the presently-exposed apparatus surface prior to each barrier layer application, based on a determination that, with 95% confidence, the probability that an encapsulation stack which comprises three consecutively-applied barrier layers will include at least one continuous permeation pathway through the stack is less than a threshold value of 1%.

In the illustrated embodiment, although gap spaces 632C and 642C of layers 630, 640 overlap, the subsequently-applied layer 650 fills in both gap spaces, thereby sealing the gap spaces 642C, 632C form forming part of a continuous permeation pathway through all of the layers of the stack 670. While layer 650 may itself include gap spaces 652A-B, none of those gap spaces align with any gap spaces of adjacent layers. As a result, the multiple barrier layers 630, 640, 650 do not include a continuous permeation pathway through the three layers, thereby rendering the stack 670 independent of any permeation pathway through the stack 670.

As shown in FIG. 6, in some embodiments, an applied barrier layer in an encapsulation stack is at least partially conformal, such that a barrier layer applied over a defect may at least partially follow the contours of the defect. As shown, portions of barrier layer 640 which fill in gap spaces 632A-B include a respective divot over each filled in gap space. Subsequently-applied layer 650 does not include such a divot over each of the divots of the previously-applied layer 640.

In some embodiments, an encapsulation stack can include one or more additional layers, relative to the multiple consecutively-applied barrier layers, which provide properties other than environmental element permeation resistance to the encapsulation stack. Such properties can include anti-reflection, exposed surface smoothing, etc. Such an additional layer can be applied subsequently to applying the multiple barrier layers, such that any permeation of environmental elements through the additional layers is restricted from permeating through the entire stack by the multiple barrier layers. In the illustrated embodiment, for example, stack 670 includes an additional outer layer 660 which fills in the gap spaces 652A-B of layer 650, embeds any particles present on the exposed surface of layer 650, and results in a smooth exposed surface 661. While layer 660 may be at least partially permeable by environmental elements, the multiple barrier layers 630, 640, 650 restrict the environmental elements from permeating to the device 620. In some embodiments, layer 660 can include one or more various materials, including one or more polymer materials, monomer materials, etc. The layer 660 can include a polymeric material which is thicker relative to the multiple barrier layers in the stack 670, for example.

FIG. 7A-D illustrate various cleaning processes which can be implemented on a presently-exposed apparatus surface, according to some embodiments. Such cleaning processes can be implemented as part of applying any of the embodiments of an encapsulation stack included herein. The presently-exposed apparatus surface upon which any of the cleaning processes can be implemented can include any of the apparatuses included in any of the embodiments included herein. In some embodiments, implementing a cleaning process on a presently-exposed apparatus surface includes implementing two or more individual cleaning processes on the presently-exposed apparatus surface.

Each of the illustrated embodiments in FIG. 7A-D illustrate implementing a cleaning process on a presently-exposed surface 721 of an apparatus 700, where the apparatus 700 includes a barrier layer 720 which is applied to a portion 710 of the apparatus prior to implementation of the illustrated cleaning process on surface 721, where the barrier layer 720 includes a gap space 722 formed by a particle 724 which lies at least partially within the gap space prior to implementation of any of the illustrated cleaning processes.

Figure 7A:
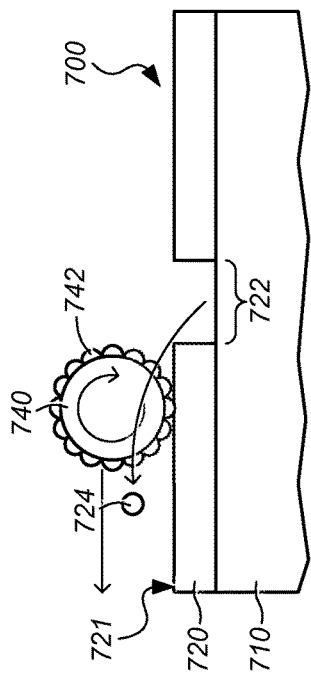
FIG. 7A-D illustrate various cleaning processes which can be implemented on a presently-exposed apparatus surface, according to some embodiments.

FIG. 7A illustrates a cleaning process which includes application of a brush device to the presently-exposed apparatus surface, where the brush device removes particles from the surface, exposing gap spaces included therein, some combination thereof, etc. based on motion of the brush device relative to the apparatus, such that the brush "sweeps" over at least a portion of the surface area of the surface. As shown, a brush device 730 is moved over surface 721, at least partially in physical contact with the surface 721, such that at least a portion of the brush device 730, when moving over the gap space 722 in which the particle 724 lies, removes the particle 724 from the gap space 722. The brush device 730 can remove the particle 724 from physical contact with any portion of the apparatus 700. In some embodiments, application of a brush device includes one or more of application of multiple brush devices to move over various portions of the surface 721, application of multiple brush devices to move over a common portion of surface 721 in different directions relative to surface 721, application of a single brush device 730 to move over a common portion of surface 721 in different directions relative to surface 721, application of a single brush device 7340 to move over different portions of the surface 721 in different directions relative to surface 721, some combination thereof, etc. In some embodiments, application of a brush device 730 to a surface 721 of apparatus 700 includes moving the apparatus 700 relative to a brush device 730 which is mounted in a fixed position, such that the brush device 730 is moved over the surface 721.

Figure 7B:
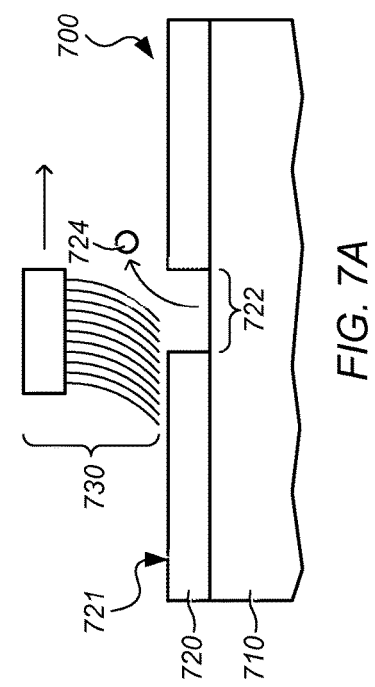

FIG. 7B illustrates a cleaning process which includes application of a scrubbing device to the presently-exposed apparatus surface 721, where the scrubbing device removes particles from the surface, exposing gap spaces included therein, some combination thereof, etc. based on the scrubbing device scrubbing the surface 721, such that the scrubbing device 740 is moved over at least a portion of the surface area of the surface and removes particles encountered by the device. As shown, a scrubbing device 740 can include a roller device which scrubber heads 742, where the device is rotated along its long axis to cause the heads 742 to scrub portions of the surface 721. The device 740 can be move over surface 721, concurrently with the rolling of the device 740, such that at least a portion of the heads 742, when moving over the gap space 722 in which the particle 724 lies, removes the particle 724 from the gap space 722. The scrubbing device 740 can remove the particle 724 from physical contact with any portion of the apparatus 700.

Figure 7C:
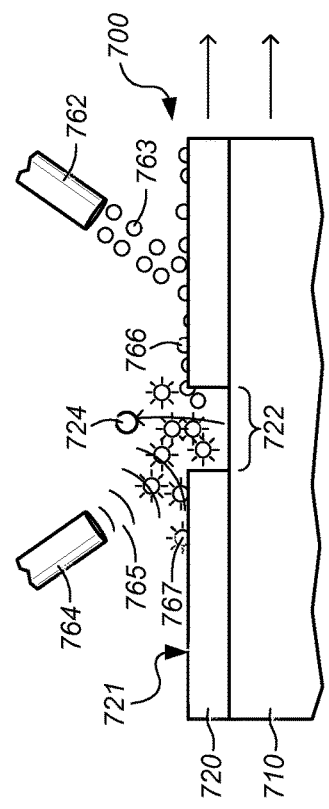

FIG. 7C illustrates a cleaning process which includes application of a fluid stream 722 to the presently-exposed apparatus surface 721 of the apparatus, where the fluid stream removes particles 724 from surface 721. The fluid stream can be provided by one or more applicators 750, where the applicator 750 can direct a fluid stream 722 to impinge upon the surface at one or more angles relative to the surface 721. In some embodiments, the fluid stream includes a jet of fluid, such as described above with reference to FIG. 5A-H. The fluid can include one or more various fluids, including one or more liquids, gases, solids, some combination thereof, etc. For example, the fluid stream can include a stream which includes frozen carbon dioxide, also referred to as carbon dioxide "flakes", dry ice particles, carbon dioxide "snow", etc. The applicator 750 can direct a fluid stream 722 which includes one or more of solid carbon dioxide, gaseous carbon dioxide, etc. across a presently-exposed surface, where the flakes can remove particles from the surface via one or more of exerting aerodynamic drag on the particles, momentum transfer, dissolving of particles induced via impact stress liquefying the flakes, some combination thereof, etc. In another example, the fluid stream can include a bubble jet stream, which can include a mixture of liquid and gaseous materials, substances, etc. in a common fluid stream. In some embodiments, the fluid 722 includes a solvent fluid which, upon contacting a particle 724, can at least partially remove the particle by at least partially breaking down the physical structure of the particle 724. In some embodiments, implementation of the cleaning process shown in FIG. 7C includes causing the fluid applicator to be moved, adjusted in orientation, some combination thereof, etc. relative to surface 721 as the applicator 750 applies the fluid stream 722, so that the fluid stream is adjustably directed over various portions of the surface 721.

Figure 7D:
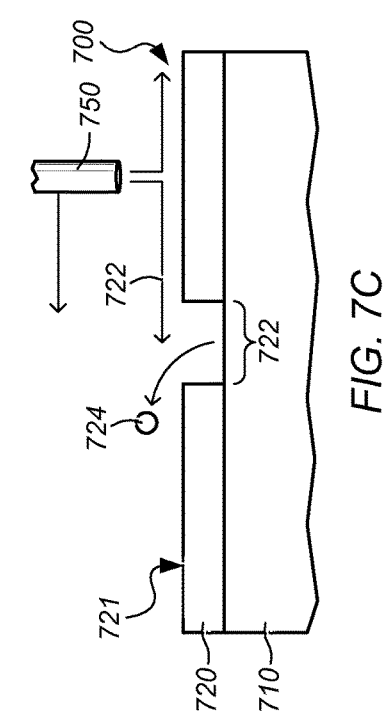

FIG. 7D illustrates a cleaning process which includes application of fluid droplets to a presently-exposed apparatus surface and applying sound waves to the surface to cause the droplets to displace a particle 724 form the surface. Such displacement can be based on vibration of the droplets as a result of the applied sound waves, implosion of droplets as a result of the applied sound waves, some combination thereof, etc. As shown, a fluid droplet applicator 762 can provide droplets 763 to the surface 721, and a sound wave generator 764 can provide sound waves 765 which, upon reaching the droplets 766 resting on the surface 721, disturb 767 the droplets 766 such that the disturbed droplets 767 cause the particle 724 to be displaced from its resting position on surface 721, including being displaced from the gap space 722. In some embodiments, the sound waves 765 include ultrasonic sound waves. In some embodiments, the disturbed droplets 767 are droplets which at least partially implode as a result of the application of ultrasonic sound waves 765 on the droplets 766. In some embodiments, the force of imploding droplets 767 on the particle 724 can force the particle 724 to be displaced from its resting position in gap space 722. In some embodiments, the generator 764 is a light beam emitter, including a laser beam source, and waves 765 are one or more light beams directed by generator 764 onto a presently-exposed surface which induce implosion, also referred to as cavitation, of droplets 767, bubbles, etc. provided onto on the surface.

In some embodiments, cleaning the presently-exposed apparatus surface 721 via at least partial implementation of any of the illustrated cleaning processes of FIG. 7A-D, including causing movement, adjustment, operation, some combination thereof, etc. of the various devices 730, 740, 750, 762, 764 shown in FIG. 7A-D is controlled by one or more control systems, which can be implemented by one or more computer systems.

Figure 8:
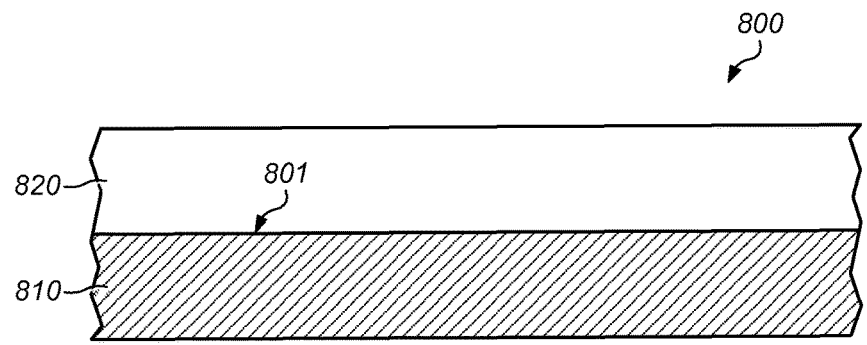
FIG. 8 illustrates a partial cross-sectional view of an apparatus which includes a substrate and an encapsulation stack applied to a surface of the substrate, according to some embodiments.

FIG. 8 illustrates a partial cross-sectional view of an apparatus which includes a substrate and an encapsulation stack applied to a surface of the substrate, according to some embodiments. The apparatus 800 can be included in any of the embodiments herein.

In some embodiments, at least a portion of an apparatus includes a substrate, and is absent any provided device, so that the encapsulation stack is applied to a surface of the substrate. In the illustrated embodiment, for example, apparatus 800 includes a substrate 810 with a surface 801, and the encapsulation stack 820, which can include multiple layers of consecutively-applied barrier layers, can be applied to the surface 801 of the substrate 810, via consecutive application of multiple barrier layers with cleaning processes implemented on presently-exposed apparatus surfaces prior to each barrier layer application.

Figure 9:
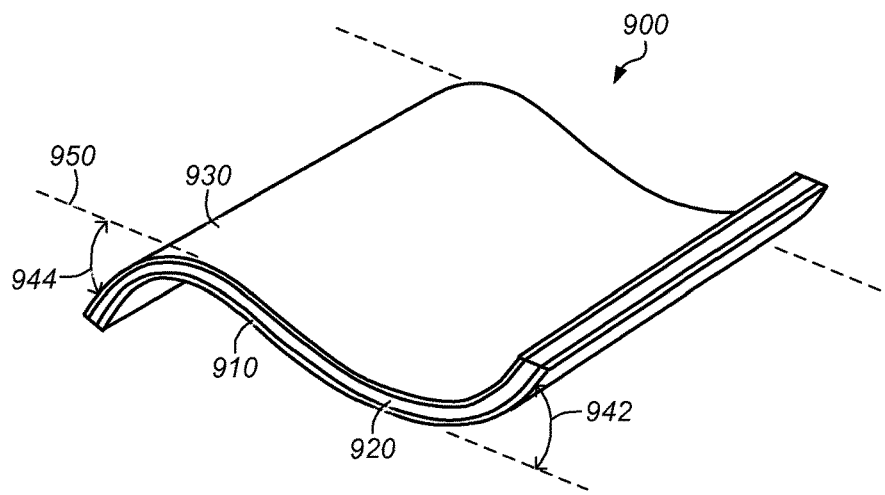
FIG. 9 illustrates a perspective view of an apparatus which is structured to be at least partially flexible and includes an encapsulation stack, according to some embodiments.

FIG. 9 illustrates a perspective view of an apparatus which is structured to be at least partially flexible and includes an encapsulation stack, according to some embodiments. The apparatus 900 can be included in any of the embodiments herein.

In some embodiments, an apparatus 900 is structured to at least partially flex, relative to a reference plane 950. In some embodiments, the apparatus is structured to flex multiple separate portions of the apparatus in multiple different directions, relative to the plane 950. As shown, apparatus 900 is structured so that one end of the apparatus can be flexed to at least one angle 942 in a positive direction relative to the plane 950, while another end of the apparatus is flex to at least one angle 944 in a negative direction relative to the plane 950. In some embodiments, the apparatus 900 is referred to as an at least partially flexible apparatus. As shown, the apparatus 900 can include a substrate 910, a device 920 provided on the substrate 910, and an encapsulation stack 930 applied to a substrate-distal surface of the device 920. The encapsulation stack 930, which can include any of the encapsulation stack embodiments included herein, is structured to flex with the apparatus 900 without failure, degradation, etc. As a result, the various barrier layers included in the multi-layer encapsulation stack 930 are structured to be flexed.

Figure 10:
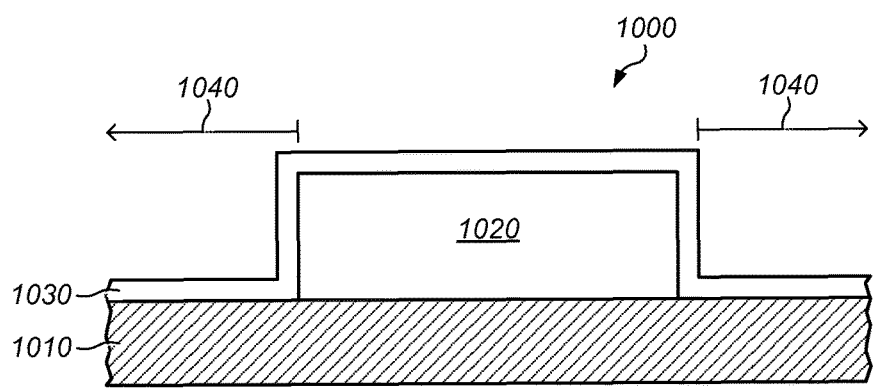
FIG. 10 illustrates a partial cross-sectional view of an apparatus which includes a substrate, a device provided on a portion of the substrate and an encapsulation stack applied to a surface of the apparatus, such that the encapsulation stack covers both at least some portions of the device and at least some exposed portions of the substrate, according to some embodiments.

FIG. 10 illustrates a partial cross-sectional view of an apparatus which includes a substrate, a device provided on a portion of the substrate and an encapsulation stack applied to a surface of the apparatus, such that the encapsulation stack covers both at least some portions of the device and at least some exposed portions of the substrate, according to some embodiments. The apparatus 900 can be included in any of the embodiments herein.

In some embodiments, an apparatus includes a device which is provided over a limited portion of a substrate, and a multi-layer encapsulation stack, which can include any of the encapsulation stack embodiments included herein, is applied to both the device and at least some portions of the substrate on which the device is not provided. For example, as shown in FIG. 10, an apparatus 1000 includes a device 1020 provided on a portion of a substrate 1010. The device 1020 can include any of the devices included in any of the embodiments included herein, including an EC device. As shown, an encapsulation stack 1030 is applied to the apparatus, where the encapsulation stack 1030 is applied to a substrate-distal surface of the device 1020, device 1020 surfaces which extend to the substrate 1010 surface, and portions 1040 of the substrate 1010 surface to which the device 1020 is not provided. As a result, some or all of the surfaces of the device 1020 are covered by the stack 1030, restricting environmental element permeation to the device 1020 from multiple surfaces of the device 1020. In some embodiments, the stack 1030 applied to portions 1040 restricts environmental element permeation to substrate 1010, which can protect the substrate against environmental element degradation, preclude environmental element permeation to the device 1020 via the substrate 1010, some combination thereof, etc.

In some embodiments, an encapsulation layer can include a multi-layer stack which is laminated on top of a surface of an apparatus. For example, an encapsulation stack can include multiple barrier layers, which can include a multi-layer stack, which is formed on a substrate, and the substrate can be laminated on a device, which can include an EC film stack. The substrate can include a thin glass substrate, polymer substrate, etc., which is resistant to moisture permeation through the substrate. The multi-layer stack can include one or more AR layers, IR cut-off filter layers, etc. In some embodiments, the multi-layer stack is at least partially permeable to moisture, and the substrate on which the multi-layer stack is formed is moisture-permeation resistant, so the encapsulation layer which includes the substrate and the multi-layer stack is resistant to moisture permeation. The substrate can be laminated to the EC film stack via one or more various adhesives, one or more index adaptation layers, etc.

In some embodiments, an apparatus included in one or more of the embodiments included herein comprises a device provided on a substrate, where the device comprises an electrochromic (EC) device. Such a device can include a multi-layered device, where the various layers can have one or more various shapes and sizes. An EC device can include an EC film stack and conductive layers on opposite sides of the EC film stack.

Figure 11:
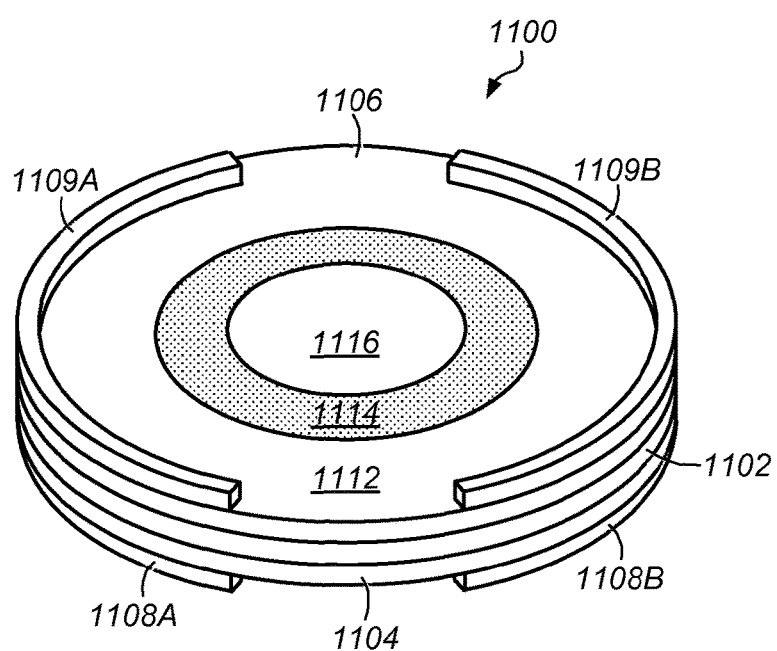
FIG. 11 illustrates a perspective view of an ovoid-shaped device which can be included in an apparatus, according to some embodiments.

FIG. 11 illustrates a perspective view of an ovoid-shaped EC device which is structured to switch between separate transmission patterns, in different regions of the EC film stack and is structured to selectively heat one or more regions of a conductive layer which corresponds to one or more of the EC film stack regions, according to some embodiments. EC device 1100 includes at least an EC film stack 1102, conductive layers 1104, 1106 on opposite sides of EC film stack 1102, and electrodes 1108A-B, 1109A-B coupled to separate ones of the conductive layers.

In some embodiments, an EC device is included in one or more portions of a camera device. The EC device can be structured to switch between separate transmission patterns to augment camera device operations. For example, an EC device can be included in a camera aperture device, where the EC device is structured to switch between separate transmission patterns to selectively apodize the camera aperture. Such an EC device can be structured to switch a particular region of the EC device to a different transmission level than other regions of the EC device. Such a particular region, in some embodiments, can be an annular region of the EC device. In some embodiments, where rapid and uniform switching of the particular region is desired, the EC device is structured to selectively heat at least the particular region of the EC device.

In some embodiments, EC device 1100 is included in a camera device and is configured to apodize the light passing through the camera device, so that less light passes through the periphery of the lens of the camera, relative to the center of the lens. Apodization can include apodizing the EC device 1100, where the EC device is comprised in the aperture of the camera device. Such apodization results in diffusion at the edges of the out-of-focus elements captured in an image of a. Such diffusion results in smoothing of the out-of-focus elements, and enables the subject to stand out more vividly against the out-of-focus elements.

In some embodiments, apodizing a camera aperture enables augmented resolution of images by the camera, as the diffraction patterns around an image of a subject on a camera sensor may be reduced. For example, an apodized aperture, reducing the amount of light which passes through the periphery of the lens, can result in an image of a subject where the Airy patterns around the image of the subject are reduced in intensity, if not removed altogether. In addition, sensitivity of the light sensor to aberrations in the lens may be mitigated.

In some embodiments, EC device 1100 is structured to selectively switch separate EC regions between separate transmission levels, so that the EC device can selectively apodize one or more of the aperture, lens, etc. of a camera device.

In the illustrated embodiment, for example, EC device 1100 has an ovoid shape, which can include a circular shape, and is structured to switch the EC film stack 1102 between at least two transmission levels, so that a particular annular region 1114 of the EC device 1100 switches to a lesser transmission level than remainder regions 1112, 1116. Such structuring can include variations in resistance in one of the conductive layers which corresponds to the region 1114, to structure the electrical potential difference across a corresponding region of the EC film stack to be greater than across EC regions corresponding to regions 1112, 1116. Such structuring can include variations in ion mobility in one or more layers in the EC film stack in regions which correspond to regions 1112, 1114, 1116. Electrodes 1108A-B, 1109A-B can be structured, as shown, to follow the curvature of the EC device 1100 to promote increased uniformity of charge distribution throughout the EC device 1100, relative to some embodiments where the electrodes extend straight, relative to the curvature of the layers 1102, 1104, 1106.

In some embodiments, various quantities of sets of electrodes are coupled to one or more of the conductive layers in an EC device. The separate conductive layers can include different quantities of sets of electrodes coupled to the respective conductive layer. For example, conductive layer 1106 can include a single set of two electrodes 1109A-B, while conductive layer 1104 can include two sets of two electrodes each, for a total of four electrodes coupled to layer 1104. A given set of electrodes can include two or more electrodes which are coupled to different regions of a conductive layer. In one example, including as shown in FIG. 11, the separate electrodes 1109A-B in a set of electrodes can be coupled to opposite edges of a conductive layer. It will be understood that a set of electrodes can be coupled to different regions of a layer, where the different regions are not opposite edges of the conductive layer. In some embodiments, where multiple sets of conductive layers are coupled to a conductive layer, one or more sets of electrodes can be structured to be used to induce an electrical potential difference between the separate conductive layers, and across the EC film stack, to cause the EC film stack to switch transmission patterns, while a separate one or more sets of electrodes can be structured to be used to induce a current, electrical potential difference, etc. across the conductive layer to cause selective heating of one or more particular limited regions of the conductive layer. In some embodiments, separate electrodes coupled to a conductive layer are spaced uniformly around the one or more edges of the conductive layer, so that current induced between the separate electrodes is substantially more uniform than if the electrodes are not uniformly spaced. Such augmented uniformity of current distribution through the layer can augment the uniformity of switching of corresponding EC film stack regions, uniformity of heating of various conductive layer regions, etc. As shown in FIG. 11, electrodes coupled to an ovoid or circular conductive layer can be coupled to different regions of the layer so that the sets of electrodes approximate a circular electrode around the edge of the conductive layer. Where additional sets of electrodes are coupled to a conductive layer, e.g., two sets of two electrodes each, the electrodes in the sets may be spaced equidistantly around the circumference of the conductive layer, where the electrodes are coupled around the circumference in alternating sets of electrodes. It will be understood that the disclosed conductive layers and electrodes coupled thereto encompass any number of sets of electrodes coupled to the layer, number of electrodes per set coupled to the layer, arrangement of electrodes coupled to the layer, number of electrodes, sets thereof, etc. coupled to different conductive layers on opposite sides of an EC film stack in an EC device, etc. For example, EC device 1100 can include eight electrodes coupled to the conductive layers 1104, 1106, where two sets of two electrodes each, for a total of four electrodes, are coupled to layer 1104 and equidistantly spaced around the circumference of the layer 1104, while two sets of two electrodes each, for a total of four electrodes, are coupled to layer 1106 and equidistantly spaced around the circumference of the layer 1106.

In some embodiments, an apparatus, including the one or more of the various apparatuses illustrated and discussed above, is structured to restrict environmental element permeation between the EC film stack of an EC device and an external environment.

In some embodiments, an environmental element-resistant, also referred to herein as "passivated", apparatus includes a single substrate, upon which a plurality, or stack, of layers of the EC device are provided. A single substrate may be used to limit the thickness of the overall apparatus. The plurality of layers may be structured to restrict moisture permeation between the EC film stack and an external environment. Such structuring of an apparatus may be referred to as "passivating" the apparatus, and an apparatus structured to restrict moisture permeation between the EC film stack and the external environment may be referred to as a "passivated" apparatus.

Such structuring or "passivating" can include providing, in the plurality of layers of the apparatus, at least one encapsulation stack. An encapsulation stack is resistant to moisture permeation, and the at least one encapsulation stack can extend over various layers in the EC device to cover various portions of various layers, including edge portions, from being exposed to the external environment. In some embodiments, an encapsulation stack includes one or more of an anti-reflective (AR) layer, infrared cut-off filter (IR cut) layer, so that the encapsulation stack is structured to simultaneously block moisture and perform one or more various functions of the EC device, including mitigating reflection where the layer includes an AR layer. In some embodiments, an EC device includes a protonic device which includes water used to enable ions to move between layers. An encapsulation stack can at least partially restrict the water in the protonic device from leaving the device and entering an external environment.

In some embodiments, an apparatus includes at least one encapsulation stack and one or more conductive layers which collectively restrict moisture permeation between the EC film stack and the external environment. Providing an encapsulation layer alone on a plurality of layers of an EC device may, in some embodiments, be insufficient to preclude environmental element permeation between the EC film stack and the external environment, as exposed edge portions of the EC device layers can transport at least some environmental elements. Structuring the apparatus so that the only exposed edge portions of layers in the plurality of layers include the at least one encapsulation layer and one or more conductive layers, where the exposed edge portions of the conductive layers resist moisture permeation, can result in a passivated EC device. In some embodiments, a conductive layer includes one or more transparent conductive layers, also referred to as transparent conducting oxides (TCOs) which resist moisture permeation. As a result, the conductive layers can extend to the edges and be exposed to the external environment at one or more edge portions, while the EC film stack remains covered from the external environment.

In some embodiments, a conductive layer includes multiple elements, including an environmental element permeation-resistant outer portion and an environmental element—transporting inner portion which is covered from exposure to the external environment by the outer portion. For example, the conductive layer may include an inner transparent conducting oxide portion which transports moisture, and one or more outer non-transparent conducting portion which resists moisture permeation. The outer portion may be exposed to the external environment, enabling the transparent conducting oxides to be protected from environmental element permeation.

In some embodiments, a passivated apparatus includes one or more sets of bus bars which are structured to cause the EC device to switch between separate transmission states with uniform and symmetrical radial optical density distribution. Each set of bus bars can include a bus bar coupled to one of the conductive layers of the EC device, on a first side of the device, and another bus bar coupled to another one of the conductive layers on an opposite side of the device. The separate bus bars in the set may be structures to extend uniformly in spacing from each other. Where the EC device is circular, the bus bars in a set may be curved to extend at a fixed distance from each other.

In some embodiments, an apparatus includes multiple separate encapsulation stacks, including a top encapsulation stack which is located between the EC film stack and an external environment and a bottom encapsulation stack which is located between the EC film stack and the substrate. A bottom encapsulation stack may be present where the single substrate transports moisture. Where the single substrate is structured to resist moisture permeation, the bottom encapsulation stack may be absent from the apparatus. In some embodiments, an apparatus includes one or more substrates.

As referred to herein, a substrate included in an apparatus can comprise one or more of various materials. The substrate can include one or more various transparent materials, including one or more glasses, crystalline materials, polymer materials, monomer materials, some combination thereof, etc. Crystalline materials can include one or more of Sapphire, Germanium, Quartz, Silicon, etc. Polymer materials can include one or more of PC, PMMA, PET, PEN, Fluor polymers, Kapton, etc. In some embodiments, a substrate can include ultra-thin glass (UTG). For example, a substrate can include one or more of Willow™ glass, AF 32® eco thin glass, D263® T thin glass, G-Leaf™ flexible glass, some combination thereof, etc. A substrate can include one or more thermally tempered materials, chemically tempered materials, etc. For example, a substrate can include GORILLA GLASS™. In another example, a substrate can include thermally-strengthened glass. In another example, A substrate can include materials having one or more various thermal expansion coefficients, including one or more of low CTE (coefficient of thermal expansion) glass, high CTE glass, some combination thereof, etc. In another example, a substrate can include one or more of a chemically strengthened glass, chemically tempered glass, including GORILLA GLASS™, chemically tempered borosilicate glass, etc. In some embodiments, a substrate includes one or more of a transparent or reflective material, including a material which can reflect at least one wavelength of the electromagnetic spectrum. A substrate can have one or more various thicknesses. For example, a substrate can have one or more thicknesses between 1 to 100 microns thick, inclusively. A substrate can include one or more of an IGU, TGU, laminate, monolithic substrate, etc.

Figure 12A:
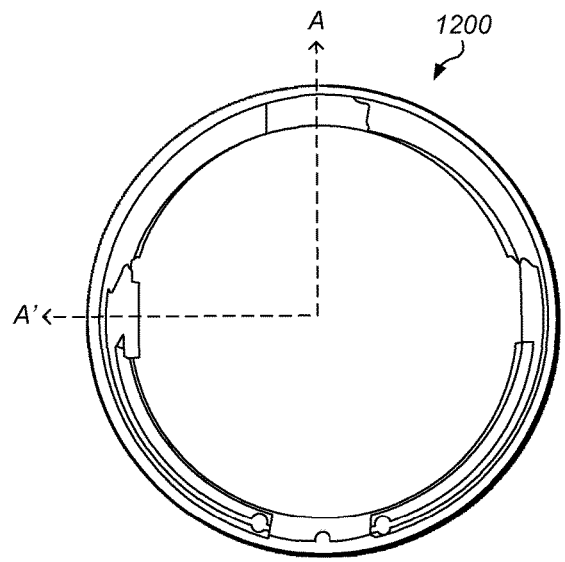
FIG. 12A-B illustrate an apparatus which includes a ovoid EC device subsequent to applying an encapsulation layer on the apparatus and coupling one or more sets of bus bars to the EC device, according to some embodiments.
Figure 12B:
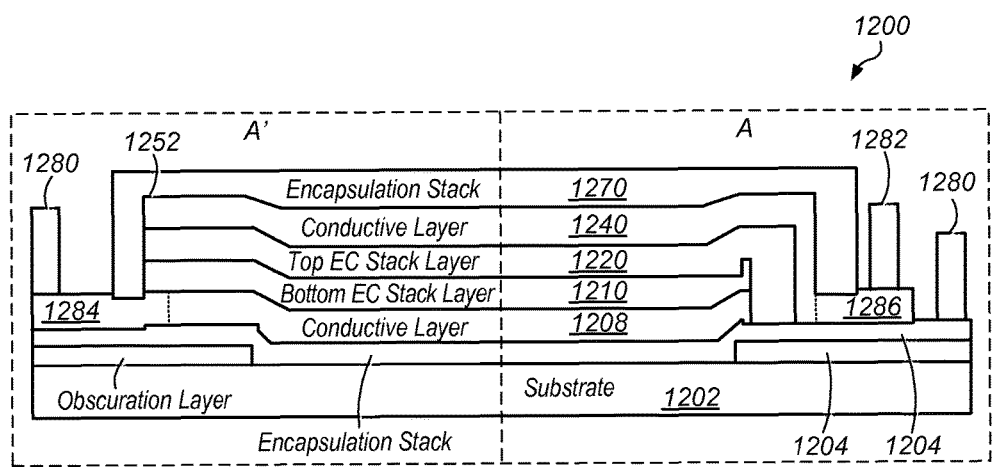

FIG. 12A-B illustrate an apparatus 1200 which comprises an EC device, an encapsulation stack 1270 provided on the EC device, and one or more sets 1280, 1282 of bus bars coupled to the EC device, according to some embodiments, so that one set of bus bars 1280 couples to at least an outer portion 1284 of a bottom conductive layer 1208 and another set of bus bars 1282 couples to an outer portion of a top conductive layer 1240. The apparatus 1200 can be included in any of the embodiments included herein. For example, the encapsulation stacks 1270, 1204 can each include a multi-layer encapsulation stack comprising multiple consecutively-applied barrier layers, where each barrier layer application is preceded by a separate cleaning process implemented on a presently-exposed surface.

As shown, in some embodiments a top encapsulation stack 1270 is provided over a portion of the EC device, so that the top encapsulation stack covers one or more exposed edge portions 1252 of the EC film stack layers 1210, 1220, thereby completing an isolation of the edge portions of the EC film stack layers 1210, 1220 from the external environment.

In some embodiments, the outer portions 1284, 1286 of the conductive layers is a separate material from the remainder of the respective layers 1208, 1240. For example, outer portions 1284, 1286, which are exposed to the external environment, may comprise non-transparent conducting material which resists moisture permeation, while the remainder of the layers 1208, 1240 comprises a transparent conducting material, including TCO, which transports moisture. As a result, the outer portions 1284, 1286 of the conductive layers collectively, with the encapsulation stacks 1270, 1206, preclude environmental element permeation between the external environment and the EC film stack layers 1210, 1220. The illustrated top encapsulation stack is minimally sufficient to complete the isolation of the EC film stack layers 1210, 1220, so that the various encapsulation stacks 1206, 1270 and conductive layers 1208, 1240 collectively isolate the EC film stack layers 1210, 1220, so that environmental element permeation between the EC film stack layers and the external environment is restricted.

As shown, FIG. 12B shows two different cross sections "A" and "A'" of the apparatus 1200, where the cross sections A and A' are perpendicular to each other. As a result, the first side of the apparatus 1200 is 90-degrees offset from the second side of the apparatus 1200.

As noted above, the top encapsulation stack 1270 can include one or more of an AR layer, IR cut layer, etc. In some embodiments, the encapsulation stack 1270 includes a dense multilayer structure (e.g., up to 100 layers) of alternating high refractive index materials and low refractive index materials. Each of the alternating layers may be up to 5 microns thick. In some embodiments, the top encapsulation stack 1270 covers the EC film stack layers, conductive layers, and bus bars. Due to the thick multilayer structure of an encapsulation, the encapsulation stack may reduce environmental element permeation so that the EC film stack is sufficiently protected and does not require a top substrate to restrict environmental element permeation.

II. Encapsulation Stack Application

Figure 13:
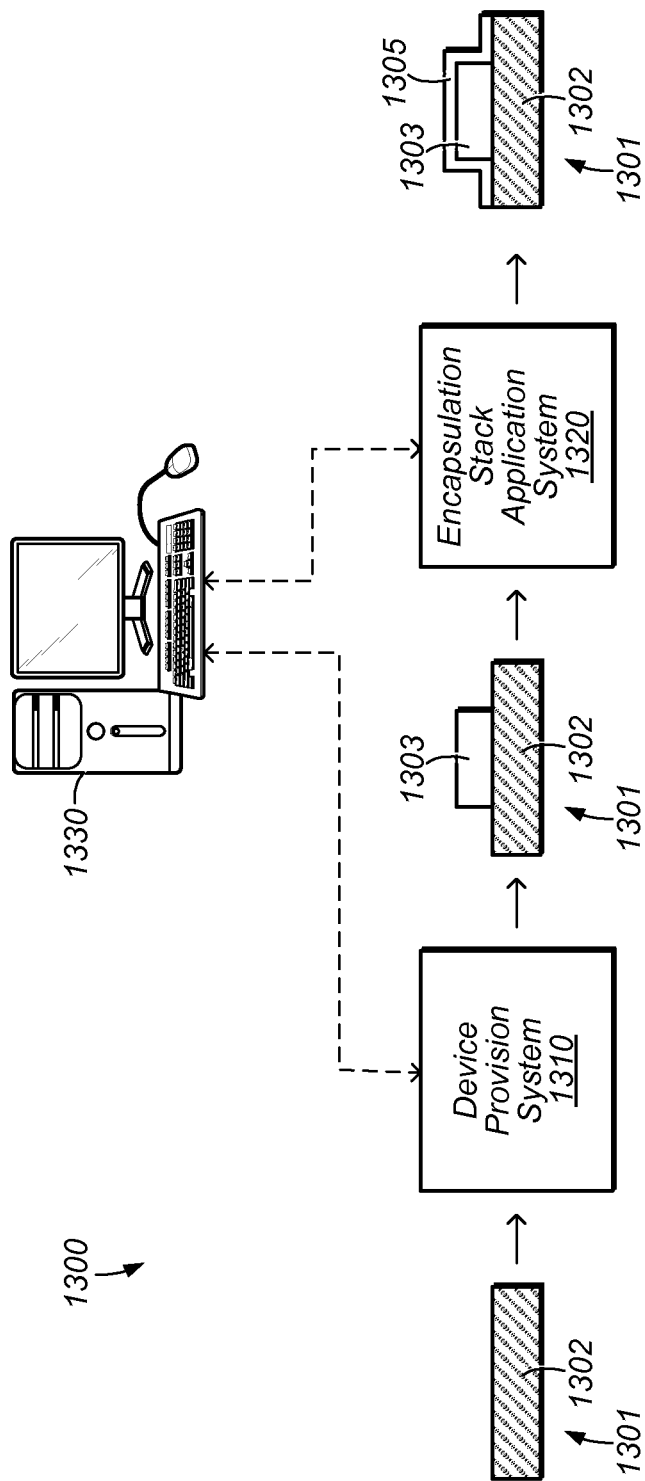
FIG. 13 illustrates an apparatus fabrication system which includes an encapsulation stack application system, according to some embodiments.

FIG. 13 illustrates an apparatus fabrication system 1300 which includes an encapsulation stack application system, according to some embodiments. The system can fabricate any of the apparatuses included in any of the embodiments included herein.

Fabrication system 1300 includes a device provision system 1310 which is structured to receive an apparatus 1301 which comprises a substrate 1302. The system 1310 is structured to provide at least one device 1303 on at least one surface of the substrate 1302, such that the system 1310 provides an apparatus 1301 which is modified such that the apparatus 1301 includes a substrate 1302 and at least one device 1303 provided on at least one surface of the substrate. As referred to herein, a device provided on a substrate can include a device deposited on the substrate. In some embodiments, a device is provided on a substrate via one or more processes separate from deposition including, for example, adhesion to the substrate via one or more adhesives.

Fabrication system 1300 includes an encapsulation stack application system 1320 which is structured to receive the apparatus 1301 which comprises the substrate 1302 and provided device 1303. System 1320 is structured to apply a multi-layer encapsulation stack to the apparatus 1301, such that the system 1320 provides an apparatus 1301 which includes the multi-layer encapsulation stack 1305 applied to at least one apparatus surface 1301. As shown, where the apparatus 1301 includes a device 1303 which is applied to a limited portion of a substrate 1302, the system 1320 can apply the encapsulation stack 1305 to both one or more surfaces of the device 1303 and one or more portions of the substrate to which the device 1303 is not provided. As discussed further below, the system 1320, in applying the stack 1305 to the apparatus 1301, can apply multiple consecutive barrier layers to the apparatus and precede each barrier layer application with cleaning a presently-exposed apparatus surface, interpose consecutive barrier layer applications with cleaning a presently-exposed apparatus surface, some combination thereof, etc.

In some embodiments, system 1300 includes a control system 1330 which is communicatively coupled to at least a portion of one or more of the system 1310. The control system 1330, which can be implemented by one or more computer systems, can control one or more devices included in one or more of the systems 1310, 1320.

Figure 14:
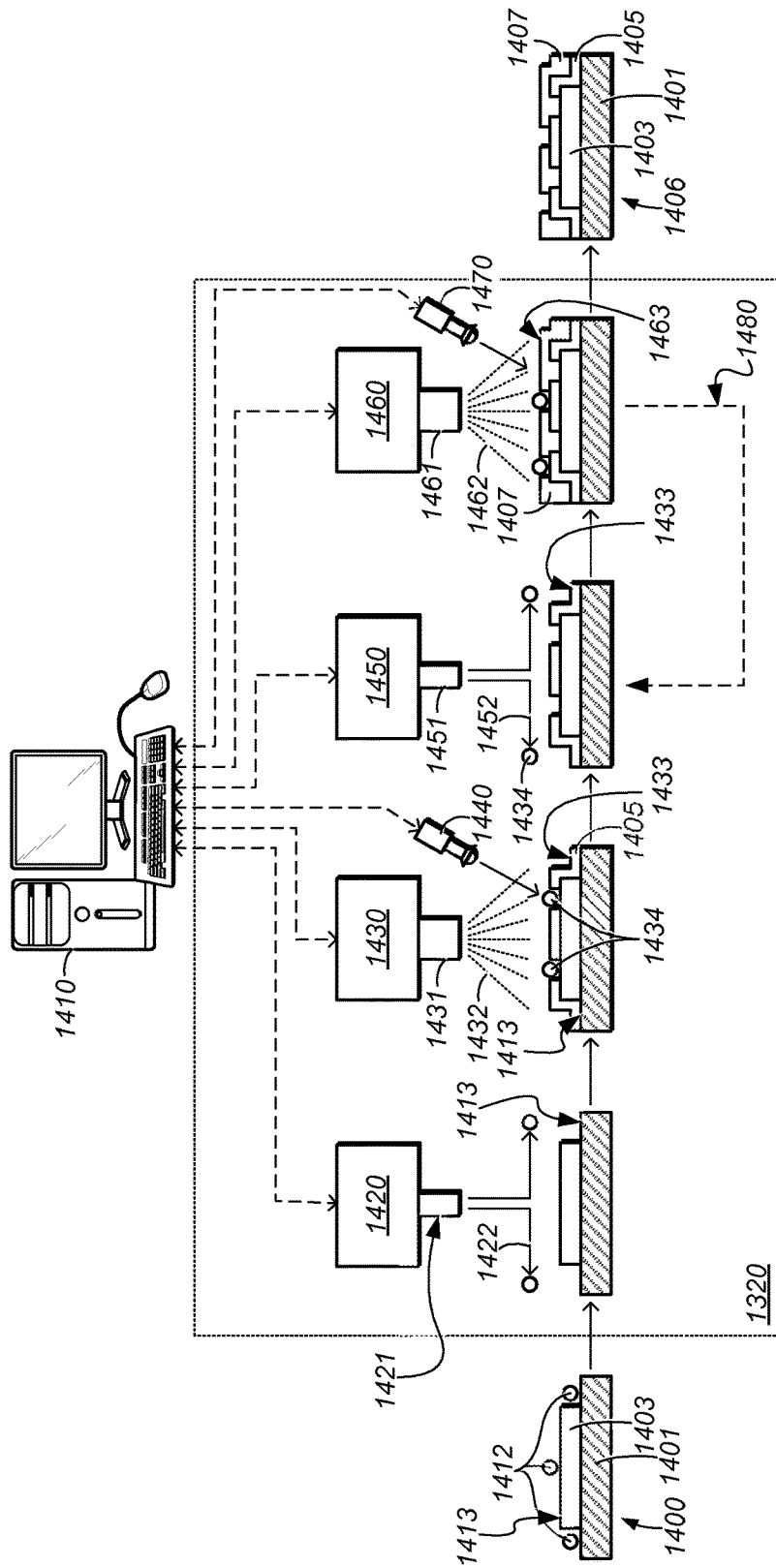
FIG. 14 illustrates an encapsulation stack application system which applies multiple barrier layers on the apparatus with preceding cleaning of the presently-exposed surface, according to some embodiments.

FIG. 14 illustrates the encapsulation stack application system 1320, shown in FIG. 13, which applies multiple barrier layers on the apparatus with preceding cleaning of the presently-exposed surface, according to some embodiments. The system can apply any of the encapsulation stacks included in any of the embodiments included herein.

System 1320 receives an apparatus 1400 which includes a substrate 1401 and a device 1403 provided on at least a portion of the substrate. As shown, the apparatus can include at least some particles 1412 which can be present on a presently-exposed surface 1413 of the apparatus 1400, where the presently-exposed apparatus surface 1413 includes an exposed surface of the device 1403 and exposed surfaces of the substrate 1401.

System 1320 includes an apparatus cleaning device 1420 which can be controlled to clean the presently-exposed apparatus surface 1413, thereby removing particles 1412 on the surface 1413. In the illustrated embodiment, device 1420 includes a fluid stream applicator 1421 which provides a fluid stream 1422 which impinges on the surface 1413 and removes the particles 1412 on the surface 1413. It will be understood that, to clean the presently-exposed apparatus surface, the cleaning device 1420 can be structured to implement any of the cleaning processes included herein. Cleaning device 1420 can be controlled to controllably direct, move, reorient, etc. the fluid stream 1422, via control of the applicator 1421, thereby implementing a cleaning process on the surface 1413.

System 1320 includes a barrier layer application device 1430 which can be controlled to apply a barrier layer 1405 on the presently-exposed apparatus surface 1413. The resulting apparatus 1400 includes a presently-exposed apparatus surface 1433 which comprises an exposed surface of layer 1405. As shown, the application of the barrier layer 1405 is implemented by an applicator 1431 of device 1430, where the applicator 1431 provides material 1432 which forms the layer 1405 on the surface 1413. Various embodiments of the device 1430 can be structured to apply the barrier layer 1405 via one or more various application processes, including any of the application processes encompassed herein. As also shown, the application of the barrier layer 1405 can result in particles 1434 being present on or at least partially within the layer 1405, such that the particles 1434 cause the formation of gap spaces extending through some or all of the thickness of the layer 1405. As shown, the illustrated particles 1434 cause the formation of two corresponding gap spaces which extend through the entirety of the layer 1405 thickness. Such particles can be provided as a side-effect of the application of the barrier layer by device 1430, as a side effect of lax cleanliness requirements in and around device 1430, some combination thereof, etc. Barrier application device 1430 can be controlled to controllably direct, move, reorient, etc. the applicator 1431, thereby implementing the application of the barrier layer 1405 on surface 1413.

As shown, system 1320 can include a sensor device 1440 which can observe the apparatus, concurrently with application of the barrier layer 1405, and monitor for defects in the applied barrier layer. In some embodiments, the sensor device 1440 comprises a camera device which generates image data associated with the presently-exposed surface 1433 subsequent to barrier layer 1405 application, where the image data can be used to determine a number, distribution, size, etc. of gap spaces in the layer 1405. Sensor data generated by the sensor device 1440, including image data, can be used to determine how many barrier layers to apply to the apparatus, whether to apply one or reo additional layers to surface 1433, some combination thereof, etc.

System 1320 includes an apparatus cleaning device 1450 which can be controlled to clean the presently-exposed apparatus surface 1433, thereby removing particles 1434 on the surface 1433. In the illustrated embodiment, device 1450 includes a fluid stream applicator 1451 which provides a fluid stream 1452 which impinges on the surface 1433 and removes the particles 1434 on the surface 1413. It will be understood that the cleaning device 1450, to clean the presently-exposed apparatus surface 1433, can be structured to implement any of the cleaning processes included herein. Cleaning device 1450 can be controlled to controllably direct, move, reorient, etc. the fluid stream 1452, via control of the applicator 1421, thereby implementing a cleaning process on the surface 1433.

As shown, implementation of the cleaning process by device 1450 results in the presently-exposed surface 1433 including an exposed surface of layer 1405 and exposed surfaces of the device 1403, through the gap spaces exposed via removal of the particles 1434.

System 1320 includes a barrier layer application device 1460 which can be controlled to apply a barrier layer 1407 on the presently-exposed apparatus surface 1433. The resulting apparatus 1400 includes a presently-exposed apparatus surface 1463 which comprises an exposed surface of layer 1407. As shown, the application of the barrier layer 1407 is implemented by an applicator 1461 of device 1460, where the applicator 1461 provides material 1462 which forms the layer 1407 on the surface 1433. Various embodiments of the device 1460 can be structured to apply the barrier layer 1407 via one or more various application processes, including any of the application processes encompassed herein. As also shown, the application of the barrier layer 1405 can result in particles being present on or at least partially within the layer 1407, such that the particles cause the formation of gap spaces extending through some or all of the thickness of the layer 1407. As shown, the illustrated particles cause the formation of two corresponding gap spaces which extend through the entirety of the layer 1407 thickness. Such particles can be provided as a side-effect of the application of the barrier layer by device 1460, as a side effect of lax cleanliness requirements in and around device 1460, some combination thereof, etc. Barrier application device 1460 can be controlled to controllably direct, move, reorient, etc. the applicator 1461, thereby implementing the application of the barrier layer 1407 on surface 1433.

As shown, the application of barrier layer 1407 by device 1430 results in a barrier layer 1407 which fills in at least some of the gap spaces in the previously-applied layer 1405. As shown, although barrier layer 1407 includes gap spaces, barrier layer 1407 fills in the gap spaces of layer 1405, thereby precluding a continuous permeation pathway through an encapsulation stack which includes the layers 1405, 1407.

As shown, system 1320 can include a sensor device 1470 which can observe the apparatus, concurrently with application of the barrier layer 1407, and monitor for defects in the applied barrier layer. In some embodiments, the sensor device 1470 comprises a camera device which generates image data associated with the presently-exposed surface 1463 subsequent to barrier layer 1407 application, where the image data can be used to determine a number, distribution, size, etc. of gap spaces in the layer 1407. Sensor data generated by the sensor device 1470, including image data, can be used to determine how many barrier layers to apply to the apparatus, whether to apply one or reo additional layers to surface 1463, some combination thereof, etc.

As shown, system 1320 can include a loop system 1480 where apparatus 1400 is redirected, subsequent to application of layer 1407 by device 1460, to cleaning device 1450, where the presently-exposed apparatus surface 1463 can be cleaned, and the apparatus 1400 can then be moved back to device 1460, where device 1460 can apply another barrier layer to the surface 1463 of apparatus 1400. In some embodiments, whether the device 1400 is directed on the loop 1480 or is directed out of the system can be based on sensor data generated at one or more of sensors 1440, 1470. For example, based on a determination that one or more continuous permeation pathways through layers 1405 and 1407 is present, apparatus 1400 can be directed along loop 1480 to device 1450, so that apparatus 1400 receives another cleaning and subsequent barrier layer application on a presently-exposed apparatus surface by devices 1450, 1460. Upon a determination, based on sensor data, that no continuous permeation pathways are present, apparatus 1400 can be directed out of the system 1320.

As shown, a control system 1410 can be communicatively coupled to the various devices of system 1320. System 1410, which can be implemented by one or more computer systems and can be included in system 1330 shown in FIG. 13, can control one or more of the devices 1420-1460, and can control whether apparatus 1400 is directed along loop 1480 one or more times, such that control system 1410 can control one or more cleaning process implementations on a presently-exposed apparatus surface 1400, control one or more barrier layer applications on a presently-exposed apparatus surface, some combination thereof, etc.

Figure 15:
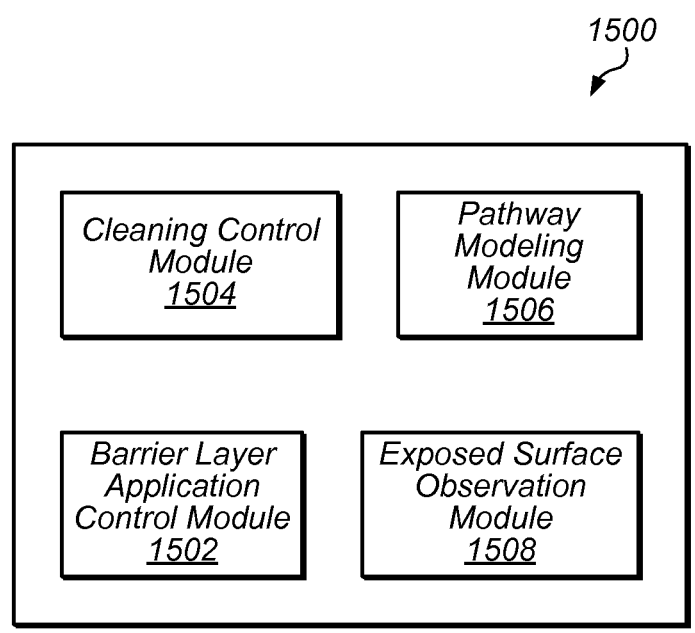
FIG. 15 illustrates a control system which is structured to control encapsulation stack application to an apparatus, according to some embodiments.

FIG. 15 illustrates a control system which is structured to control encapsulation stack application to an apparatus, according to some embodiments. The control system 1500 can be included in one or more of the control systems disclosed herein, including encapsulation stack application system 1320 illustrated in FIG. 13. The control system 1500 can be implemented by one or more computer systems, including the computer system illustrated in FIG. 17. Control system 1500 includes various modules structured to implement various aspects of the control system 1500.

Control system 1500 includes a barrier layer application control module 1502. The module 1502 can control a barrier layer applicator, including any of the devices, applicators, etc. illustrated and discussed herein, to controllably apply a barrier layer to a presently-exposed apparatus surface. In some embodiments, module 1502 controls multiple separate barrier layer applicators, where each separate applicator applies a separate barrier layer, of a plurality of consecutively-applied barrier layers, to a presently-exposed apparatus surface. In some embodiments, module 1502 commands a given applicator to apply a barrier layer to an exposed apparatus surface based on a determination that the apparatus is located within a certain physical region relative to the applicator. In some embodiments, module 1502 commands a given applicator to apply a barrier layer to a presently-exposed apparatus surface based on a determination that a probability of the presence of a pathway between an environmental element-sensitive portion of the apparatus and an external environment, at one or more particular confidence levels, exceeds a certain threshold. In some embodiments, module 1502 commands a given applicator to apply a barrier layer to a presently-exposed apparatus surface based on a determination, based on observation of the exposed surface, that one or more gap spaces are present in the exposed surface. In some embodiments, module 1502 can control a process pathway through which a given apparatus is directed, such that module 1502 can redirect a given apparatus to an applicator such that additional barrier layers are applied to the apparatus, an exit of the encapsulation stack application system, etc. based on the determined probability, observation of the apparatus, some combination thereof, etc.

Control system 1500 includes a cleaning control module 1504. The module 1504 can control one or more devices, applicators, etc. illustrated and discussed herein, to controllably clean a presently-exposed apparatus surface by the apparatus surface cleaner device. In some embodiments, module 1504 controls multiple separate cleaner devices, where each separate cleaner device implements separate cleanings of the presently-exposed apparatus surface prior to separate barrier layer applications, between separate consecutive barrier layer applications, some combination thereof, etc. In some embodiments, module 1504 commands a given cleaner device to clean a presently-exposed apparatus surface based on a determination that the apparatus is located within a certain physical region relative to the apparatus surface cleaner device. In some embodiments, module 1504 commands a given cleaner device to clean a presently-exposed apparatus surface based on a determination that one or more particles are present on the presently-exposed apparatus surface. As referred to herein, a particle "on" an exposed surface of a barrier layer can be at least partially "in" the barrier layer, and a particle which is at least partially within a barrier layer can be at least partially "on" an exposed surface of the barrier layer.

Control system 1500 includes a pathway modeling module 1506. The module 1506 can determine a probability, at one or more particular confidence levels, that a given encapsulation stack, comprising a certain number of barrier layers, with one or more barrier layers comprising one or more types of barrier layer comprising one or more materials, is independent of (i.e., does not include) any continuous permeation pathways between environmental element-sensitive portions of the apparatus and an external environment via the encapsulation stack. Such a determination can be based on various factors, which can include the various types of barrier layers included in the stack, the materials included in the various layers, the number of barrier layers in the stack, the size, shape, area, etc. of the stack, the one or more cleaning processes implemented on a presently-exposed apparatus surface prior to one or more of the barrier layer applications, some combination thereof, etc. In some embodiments, at least some of the factors are provided to module 1506 via data input received from one or more external sources. In some embodiments, at least some of the factors are provided to module 1506 based on observation of the apparatus via one or more sensor devices. In some embodiments, based on the provided factors associated with an apparatus, module 1506 determines a particular number of barrier layers included in an encapsulation stack for which the probability of a continuous permeation pathway through the stack, at a certain confidence level, is less than a certain threshold. In some embodiments, based on the provided factors associated with an apparatus, module 1506 determines a particular number of barrier layers included in an encapsulation stack for which the probability that the encapsulation stack is independent of any continuous permeation pathways through the stack, at a certain confidence level, exceeds a certain threshold. In some embodiments, based on the determined particular number of barrier layers, modules 1502, 1504 collectively implement application of the particular number of barrier layers to the apparatus, such that the apparatus includes an encapsulation stack which comprises at least the particular number of barrier layers.

Control system 1500 includes an exposed surface observation module 1508. Module 1508 can observe an apparatus at one or more stages in the encapsulation stack application process, including observing the apparatus concurrently with, subsequently to, prior to, some combination thereof, etc. with regard to one or more barrier layer applications, cleaning process implementations, etc. with regard to an apparatus. Such observation of an apparatus can be based on sensor data generated at one or more sensor devices. Such sensor devices can include one or more camera devices, light beam scanning devices, etc. Based on such observation, module 1508 can determine the presence, location, size, quantity, some combination thereof, etc. of particles on an exposed apparatus surface, the presence, location, size, quantity, some combination thereof, etc. of gap spaces present in an exposed apparatus surface, etc. Based on one or more of such determinations module 1508 can determine whether to direct a given apparatus to receive additional cleaning, barrier layer application, etc.; whether to direct a given apparatus to exist an encapsulation stack application system, some combination thereof, etc.

FIG. 16A illustrates applying a multi-layer encapsulation stack, according to some embodiments. The application illustrated in FIG. 16A can be implemented by one or more control systems, which can be implemented by one or more computer systems.

At 1602, an apparatus is received. The apparatus can include one or more of a substrate, one or more devices provided on one or more surfaces of the substrate, etc. For example, a received apparatus can include a substrate and an OLED device which is provided on a surface of the substrate.

At 1603, a particular number of barrier layers to be included in an applied encapsulation stack is determined. As is discussed further below with reference to FIG. 16B, the determination can include determining a particular number of barrier layers to consecutively apply, such that a probability that the multiple consecutively-applied barrier layers collectively include no more than a particular number of continuous permeation pathways, at a particular confidence level, is less than a particular threshold probability value.

At 1604, a presently-exposed apparatus surface is at least partially cleaned. Such cleaning can include implementing one or more cleaning processes on the presently-exposed apparatus surface. The presently-exposed surface can include one or more surfaces of one or more previously-applied barrier layers, one or more gap spaces in one or more previously-applied layers, an exposed surface of a device, an exposed surface of a substrate, some combination thereof, etc. The implemented cleaning processes can include one or more of any of the cleaning processes encompassed herein.

At 1606, a barrier layer is applied to the presently-exposed apparatus surface. The barrier layer can include any of the various barrier layers encompassed herein and can be applied via any of the various barrier layer application processes encompassed herein, including, without limitation, a thin film barrier applied via a sputtering application process, a thin film barrier applied via an atomic layer deposition process, etc.

At 1608, a determination is made regarding whether the number of barrier layers applied to the received apparatus equals the determined particular number of barrier layers. If so, the process ends. If not, additional cleanings and barrier layer applications 1604, 1606 are implemented until the number of applied barrier layers matches the determined particular number. Each subsequent cleaning process 1604 implemented can include one or more different cleaning processes relative to a previously-implemented cleaning process. Each subsequent barrier layer application 1606 can include applying a different barrier layer relative to a previously-applied barrier layer, applying a barrier layer via a different application process relative to the previous barrier layer application, some combination thereof, etc.

FIG. 16B illustrates determining a particular number of barrier layers to apply to establish a multi-layer encapsulation stack, according to some embodiments. Determination of a particular "number" of barrier layers can also be referred to as determination of a particular "quantity" of barrier layers. The determination illustrated in FIG. 16B can be implemented by one or more control systems, which can be implemented by one or more computer systems. As shown, the determination is included in the determination 1603 illustrated in FIG. 16A.

At 1621, one or more sets of apparatus factors are received. Such factors are used as part of determining a probability that one or more continuous permeation pathways are present through an encapsulation stack which includes a particular number of barrier layers. Such apparatus factors can include the surface area of the apparatus covered by the encapsulation stack, estimated cleanliness of the area in which barrier layers are applied (e.g., a particular number of particles, at a certain particle size, per cubic meter of volume in the area), etc.

At 1623, one or more sets of encapsulation stack factors are received. Such factors are used as part of determining the probability, as described above. Such encapsulation stack factors can include one or more of the materials included in each of the layers to be applied, the surface area of the apparatus covered by each of the layers, the estimated distribution and size of particles present on an exposed surface preceding and following each barrier layer application, an estimated number, distribution, and size of gap spaces present in each individual barrier layer upon application of the given barrier layer, some combination thereof, etc.

At 1625 and 1627, a particular probability confidence level and threshold value is determined. The determined threshold value indicates the threshold acceptable probability of the presence of no more than a certain number of continuous permeation pathways through the encapsulation stack. The certain number of continuous permeation pathways can be predetermined, and can be determined such that the threshold probability is a probability that the encapsulation stack includes no continuous permeation pathways through the barrier layers of the stack.

At 1629, the particular number of barrier layers to consecutively apply, such that a probability that the multiple consecutively-applied barrier layers collectively include no more than a particular number of continuous permeation pathways, at a particular confidence level, is less than a particular threshold probability value, is determined. The determination can include applying the received factors, confidence level, and threshold value to a model which determines the probability that an encapsulation stack includes no more than the certain number of continuous permeation pathways, at the determined confidence level as a function of at least the number of barrier layers included in the encapsulation layer. The particular number of layers can be determined by solving the model, which can include determining the minimum number of barrier layers at which the probability is less than the probability threshold.

In some embodiments, the above probability is a probability that the encapsulation layer is free from including any more than a certain number of continuous permeation pathways, and the threshold value is a threshold probability that the encapsulation layer, including a particular number of barrier layers, is free from including any more than a certain number of continuous permeation pathways.

Based on one or more of the factors, a probability can be determined, at one or more confidence levels, that an encapsulation stack comprising a given number of barrier layers will not include any pathways for environmental element permeation through the stack, via gap spaces in the various barrier layers. The particular number of layers can be determined based on a minimum number of layers at which the determined probability, at a particular confidence level, that the resulting encapsulation stack includes at least a certain minimum number of pathways through the stack is less than a threshold value. In another example, the particular number of layers can be determined based on a minimum number of layers at which the determined probability, at a particular confidence level, that the resulting encapsulation stack includes no more than a certain minimum number of pathways through the stack is greater than a threshold value.

Figure 17:
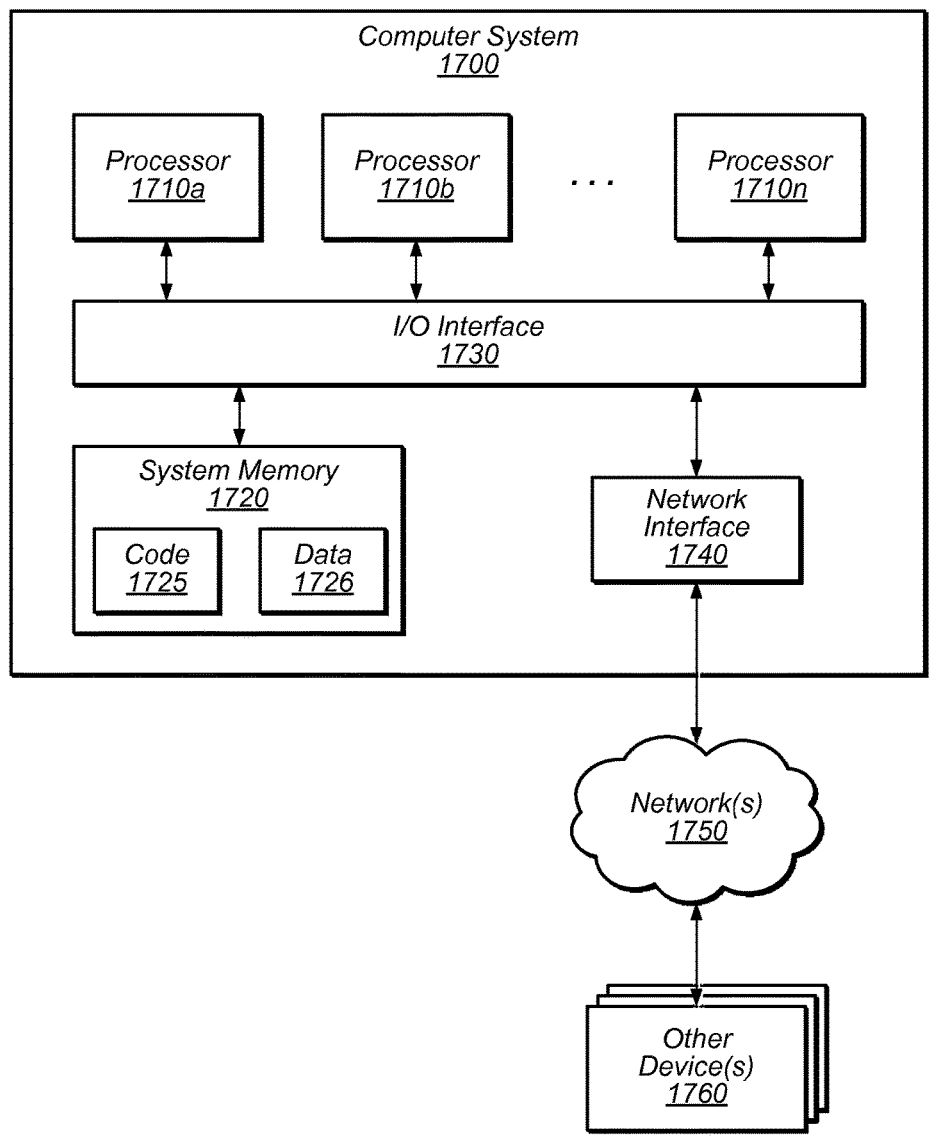
FIG. 17 is a block diagram illustrating an example computer system that may be used in some embodiments.

FIG. 17 is a block diagram illustrating an example computer system that may be used in some embodiments.

In some embodiments, a system that implements a portion or all of one or more of the technologies, including but not limited to a portion or all of a control system structured to control at least application of a multiple-layer encapsulation stack on an apparatus, where at least one cleaning process precedes each application of each barrier layer in the stack, interposes consecutive barrier layer applications, etc., an end-user device which includes an apparatus which includes a multi-layer encapsulation stack, and various methods, systems, components, devices, and apparatuses as described herein, may include a general-purpose computer system that includes or is configured to access one or more computer-accessible media, such as computer system 1700 illustrated in FIG. 17. In the illustrated embodiment, computer system 1700 includes one or more processors 1710 coupled to a system memory 1720 via an input/output (I/O) interface 1730. Computer system 1700 further includes a network interface 1740 coupled to I/O interface 1730.

In various embodiments, computer system 1700 may be a uniprocessor system including one processor 1710, or a multiprocessor system including several processors 1710 (e.g., two, four, eight, or another suitable number). Processors 1710 may be any suitable processors capable of executing instructions. For example, in various embodiments, processors 1710 may be general-purpose or embedded processors implementing any of a variety of instruction set architectures (ISAs), such as the x86, PowerPC, SPARC, or MIPS ISAs, or any other suitable ISA. In multiprocessor systems, each of processors 1710 may commonly, but not necessarily, implement the same ISA.

System memory 1720 may be configured to store instructions and data accessible by processor(s) 1710. In various embodiments, system memory 1720 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of a control system structured to control at least application of a multiple-layer encapsulation stack on an apparatus, where at least one cleaning process precedes each application of each barrier layer in the stack, interposes consecutive barrier layer applications, etc., an end-user device which includes an apparatus which includes a multi-layer encapsulation stack, and various methods, systems, components, devices, and apparatuses as described herein, are shown stored within system memory 1720 as code 1725 and data 1726.

In one embodiment, I/O interface 1730 may be configured to coordinate I/O traffic between processor 1710, system memory 1720, and any peripheral devices in the device, including network interface 1740 or other peripheral interfaces. In some embodiments, I/O interface 1730 may perform any necessary protocol, timing or other data transformations to convert data signals from one component (e.g., system memory 1720) into a format suitable for use by another component (e.g., processor 1710). In some embodiments, I/O interface 1730 may include support for devices attached through various types of peripheral buses, such as a variant of the Peripheral Component Interconnect (PCI) bus standard or the Universal Serial Bus (USB) standard, for example. In some embodiments, the function of I/O interface 1730 may be split into two or more separate components, such as a north bridge and a south bridge, for example. Also, in some embodiments some or all of the functionality of I/O interface 1730, such as an interface to system memory 1720, may be incorporated directly into processor 1710.

Network interface 1740 may be configured to allow data to be exchanged between computer system 1700 and other devices 1760 attached to a network or networks 1750, such as other computer systems or devices as illustrated in FIGS. 1 through 16A-B for example. In various embodiments, network interface 1740 may support communication via any suitable wired or wireless general data networks, such as types of Ethernet network, for example. Additionally, network interface 1740 may support communication via telecommunications/telephony networks such as analog voice networks or digital fiber communications networks, via storage area networks such as Fibre Channel SANs, or via any other suitable type of network and/or protocol.

In some embodiments, system memory 1720 may be one embodiment of a computer-accessible medium configured to store program instructions and data for implementing embodiments of methods as described above relative to FIGS. 1 through 16A-B. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1700 via I/O interface 1730. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 1700 as system memory 1720 or another type of memory. Further, a computer-accessible medium may include transmission media or signals such as electrical, electromagnetic, or digital signals, conveyed via a communication medium such as a network and/or a wireless link, such as may be implemented via network interface 1740.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "module" is a component or a combination of components. A module may include functional elements and systems, such as computer systems, circuit boards, racks, blowers, ducts, and power distribution units, as well as structural elements, such a base, frame, housing, or container.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

In some embodiments, an EC device includes a substrate which comprises a thin glass laminate, including a paper glass foil and a layer of adhesive. The thin glass laminate can include a glass foil that is approximates 25 micrometers in thickness. In some embodiments, the thin glass laminate can include one or more various thickness. For example, the thin glass laminate can be approximately 50 micrometers in thickness.

In some embodiments, photochromic or thermochromic materials may be used in place or in addition to the electrochromic (EC) materials disclosed herein. For example, some regions of a device may comprise electrochromic materials, including an EC film stack, while other regions may comprise at least one of an electrochromic, photochromic, or thermochromic material. Suitable photochromic materials include, but are not limited to, triaryl-methanes, stilbenes, azastilbenes, nitrones, fulgides, spriropyrans, naphthopyrans, sprio-oxazines, and quinones. Suitable thermochromic materials include, but are not limited to, liquid crystals and leuco dyes. Both photochromic and thermochromic materials can be formed on the substrate in a well-known manner. No bus bars, electrodes, etc. would be needed for photochromic or thermochromic dynamic regions because light and heat respectively modulate the properties of the materials. One exemplary embodiment using photochromic and/or thermochromic dynamic regions could be a window having at least one electrochromic dynamic region towards the top of the window that is actively controlled for daylighting, to selectively switch between one or more particular transmission patterns, etc., and at least one photochromic dynamic region towards the bottom of the window that self-darkens when under direct light, and at least a second electrochromic region posited in another region of the device.

In some embodiments, one or more EC devices can be used as an aperture filter, iris, etc. for a camera device, and may be structured to selectively apodize, as discussed further above. In some embodiments, one or more EC devices can be included in architectural 'motherboards' which can be shipped across extended distance before further processing. In some embodiments, one or more EC devices can be included in one or more single pane windows for transportation applications and other uses where weight is important. In some embodiments, one or more EC devices, including one or more EC devices which include a single substrate, can be used to hide or reveal information on displays for hand held devices, computers, etc. In some embodiments, one or more EC devices can be used in dynamic eyewear.

Further, it should be understood that one embodiment of the subject matter disclosed herein can comprise a window, including an architectural window, having a single pane, or lite, that comprises a plurality of independently controlled dynamic regions. Another embodiment of the subject matter disclosed herein comprises an insulated glazing unit ("IGU") comprising multiple regions of electrochromic window on one pane and clear glass on the other pane. Yet another embodiment of the subject matter disclosed herein comprises an IGU comprising multiple regions of electrochromic window on one pane and a low-E, tinted, or reflective glass on the other pane. Still another embodiment of the subject matter disclosed herein comprises an IGU comprising multiple regions of electrochromic window on one pane of the IGU and a patterned or special glass on the other pane in which the patterning or features may match, compliment, and/or contrast the areas of dynamic regions on the first pane. It should be understood that the foregoing embodiments can be configured, structured, etc. so that the lite comprising the plurality of dynamic region is a clear lite, a low-E lite, a reflective, and/or partially reflective lite.

In some embodiments, one or more EC devices, including one or more of the EC devices, end-user devices, control systems, etc. illustrated and disclosed with reference to one or more of FIGS. 1-17, can be included in various applications, including EC displays, transportation windows, architectural glass applications, etc.

What is claimed is:

1. An apparatus, comprising:
   a substrate; and
   a multi-layer encapsulation stack, applied to the substrate, that is structured to restrict environmental element permeation between the substrate and an ambient environment, wherein the multi-layer encapsulation stack comprises:
      a plurality of consecutively-applied thin film barrier layers, wherein at least one separate thin film barrier layer is applied to a presently-exposed layer surface of a previously-applied thin film barrier layer, subsequently to the presently-exposed layer surface being at least partially cleaned, via a cleaning process implemented at least in part by a device, such that at least a portion of the particles are carried away from the presently-exposed layer surface to produce a clean presently-exposed layer surface that has fewer of the particles when the at least one separate thin film barrier layer is applied than the presently-exposed layer surface would have had without being cleaned via the cleaning process, wherein the at least one separate thin film barrier layer at least partially fills in exposed gap spaces, formed by the at least a portion of the particles being carried away, in the clean presently-exposed layer surface.

2. The apparatus of claim 1, wherein the multi-layer encapsulation stack comprises a minimum number of thin film barrier layers to preclude the existence of any continuous permeation pathway, formed via aligned gap spaces, through the thin film barrier layers in the multi-layer encapsulation stack.

3. The apparatus of claim 1, wherein the apparatus is formed by a process comprising:
   at least partially cleaning the presently-exposed layer surface of particles to expose gap spaces, formed by the particles, in the presently-exposed layer surface, wherein the at least partially cleaning comprises at least one of:
      applying a brush device to the presently-exposed layer surface;
      applying a scrubbing device to the presently-exposed layer surface;
      applying a sonic wave to the presently-exposed layer surface;
      applying a fluid stream to the presently-exposed layer surface;
      directing a stream of carbon dioxide flakes to the presently-exposed layer surface; or
      directing a bubble jet stream, comprising a mixture of liquid and gaseous substances, to the presently-exposed layer surface.

4. The apparatus of claim 1, comprising:
   a device provided on the substrate, wherein the device comprises:
      an electrochromic (EC) device comprising at least two separate conductive layers, on opposite sides of an electrochromic (EC) thin film stack;
   wherein the multi-layer encapsulation stack is applied on a substrate-distal surface of the device.

5. The apparatus of claim 4, wherein:
   the device comprises a camera aperture filter structured to selectively switch between at least two separate transmission states, based at least in part upon selectively varying voltage applied to the separate conductive layer segments.

6. The apparatus of claim 1, wherein:
   the environmental element permeation comprises permeation of at least one of water or oxygen.

7. The apparatus of claim 1, wherein the substrate and multi-layer encapsulation stack are formed by a process comprising:
   structuring the substrate to resist environmental element permeation between an external environment and the substrate, the structuring comprising:
      applying the plurality of barrier layers to the substrate, such that at least one barrier layer is applied to a presently-exposed surface which comprises an exposed layer surface of a previously-applied barrier layer; and
      interposing consecutive barrier layer applications with a cleaning of the presently-exposed surface, such that each consecutively-applied barrier layer is applied to a cleaned presently-exposed surface.

8. The apparatus of claim 7, wherein:
   interposing consecutive barrier layer applications with a cleaning of the presently-exposed surface comprises implementing, on the presently-exposed surface, a cleaning process which is structured to remove at least one particle present on at least the presently-exposed surface and expose at least one gap space formed by the at least one particle, such that a subsequently-applied barrier layer at least partially fills the at least one exposed gap space.

9. The apparatus of claim 7, wherein applying the plurality of barrier layers to the substrate comprises:
applying a particular quantity of barrier layers to the substrate, such that the plurality of barrier layers comprises the particular quantity of barrier layers;
wherein the particular quantity is a minimum quantity of barrier layers such that the plurality of barrier layers is independent of continuous permeation pathways, through one or more gap spaces, through the plurality of barrier layers.

10. The apparatus of claim 7, wherein the process to form the substrate and multi-layer encapsulation stack further comprises:
determining, between consecutive barrier layer applications and based on generated sensor data, that the plurality of barrier layers is independent of continuous permeation pathways, through one or more gap spaces, through the plurality of barrier layers, such that at least one barrier layer is subsequently applied based at least in part upon the determining.

11. The apparatus of claim 7, wherein:
at least one barrier layer, of the plurality of barrier layers, comprises a thin film barrier, wherein applying the thin film barrier comprises coating a presently-exposed surface with material comprising the thin film barrier.

12. The apparatus of claim 7, wherein:
the environmental element permeation comprises permeation of at least one of water or oxygen.

13. The apparatus of claim 7, wherein:
structuring at least a substrate to resist environmental element permeation between an external environment and the substrate comprises structuring a device provided on the substrate to resist environmental element permeation between the external environment and the device; and
implementing the plurality of layering processes over an outer surface of the substrate comprises implementing a plurality of layering processes over an outer substrate-distal surface of the device.

14. The apparatus of claim 13, wherein:
the device comprises at least one of:
an electrochromic (EC) device comprising at least two separate conductive layers, on opposite sides of an electrochromic (EC) stack;
a camera aperture filter structured to selectively switch between at least two separate transmission states, based at least in part upon selectively varying voltage applied to the separate conductive layer segments;
a thin film battery device;
an organic light-emitting diode (OLED) device; or
a photovoltaic film device.

15. The apparatus of claim 7, wherein the process further comprises:
cleaning the presently-exposed surface, wherein the cleaning comprises at least one of:
applying a brush device to the presently-exposed surface;
applying a scrubbing device to the presently-exposed surface;
applying a sonic wave to the presently-exposed surface;
applying a fluid stream to the presently-exposed surface;
directing a stream of carbon dioxide flakes to the presently-exposed surface; or
directing a bubble jet stream, comprising a mixture of liquid and gaseous substances, to the presently-exposed surface.

16. The apparatus of claim 1, wherein the substrate and multi-layer encapsulation stack are formed by a process comprising:
cleaning a presently-exposed apparatus surface, which comprises an exposed surface of an apparatus, via implementation of a particular cleaning process which is structured to at least partially remove particles from the presently-exposed apparatus surface;
subsequent to cleaning the presently-exposed apparatus surface, applying a first barrier layer to the presently-exposed apparatus surface, wherein the first barrier layer is structured to resist environmental element permeation, such that the presently-exposed apparatus surface, subsequent to applying the first barrier layer, comprises an exposed surface of the applied first barrier layer; and
subsequent to applying the first barrier layer, applying at least one additional barrier layer to the presently-exposed apparatus surface, such that the apparatus comprises a multi-layer encapsulation stack of barrier layers structured to restrict environmental element permeation between an external environment and the apparatus, wherein applying each of the at least one additional barrier layers comprises:
cleaning the presently-exposed apparatus surface via implementation of an additional cleaning process which is structured to at least partially remove particles from the presently-exposed apparatus surface; and
subsequent to cleaning the presently-exposed apparatus surface, applying an additional barrier layer to the presently-exposed apparatus surface, wherein the additional barrier layer is structured to resist environmental element permeation, such that the presently-exposed apparatus surface, subsequent to applying the additional barrier layer, comprises an exposed surface of the applied additional barrier layer.

17. The apparatus of claim 16, wherein applying at least one additional barrier layer comprises:
applying a particular quantity of additional barrier layers to the apparatus, such that the multi-layer encapsulation stack of barrier layers comprises a particular quantity of barrier layers;
wherein the particular quantity is a minimum quantity of layers such that the plurality of barrier layers is independent of any continuous permeation pathway, through one or more gap spaces, through the plurality of barrier layers.

18. The apparatus of claim 16, wherein the process to form the substrate and multi-layer encapsulation stack further comprises:
terminating application of additional barrier layers, based at least in part upon a determination that the applied plurality of barrier layers is collectively independent of any continuous permeation pathway, through one or more gap spaces, through the plurality of barrier layers.

19. The apparatus of claim 16, wherein:
each of the particular cleaning processes and additional cleaning processes comprises at least one of:
applying a brush device to the presently-exposed apparatus surface;

applying a scrubbing device to the presently-exposed apparatus surface;

applying a sonic wave to the presently-exposed apparatus surface;

applying a fluid stream to the presently-exposed apparatus surface;

directing a stream of carbon dioxide flakes to the presently-exposed apparatus surface; or directing a bubble jet stream, comprising a mixture of liquid and gaseous substances, to the presently-exposed apparatus surface.

20. The apparatus of claim 16, wherein:

the apparatus comprises a device provided on a surface of the substrate; and cleaning and subsequently applying a first barrier layer to the presently-exposed apparatus surface comprises cleaning, and subsequently applying the first barrier layer to, at least a substrate-distal surface of the device.

* * * * *